United States Patent
Kaneda

(10) Patent No.: US 10,453,890 B2
(45) Date of Patent: Oct. 22, 2019

(54) SOLID-STATE IMAGE SENSOR WITH SEPARATED ELECTRODE, METHOD OF MANUFACTURING THE SAME, AND ELECTRONIC DEVICE

(71) Applicant: SONY SEMICONDUCTOR SOLUTIONS CORPORATION, Kanagawa (JP)

(72) Inventor: Yukio Kaneda, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 0 days.

(21) Appl. No.: 15/521,718

(22) PCT Filed: Oct. 22, 2015

(86) PCT No.: PCT/JP2015/079820
§ 371 (c)(1),
(2) Date: Apr. 25, 2017

(87) PCT Pub. No.: WO2016/072281
PCT Pub. Date: May 12, 2016

(65) Prior Publication Data
US 2017/0243912 A1    Aug. 24, 2017

(30) Foreign Application Priority Data

Nov. 5, 2014 (JP) ................. 2014-225190

(51) Int. Cl.
*H01L 27/146* (2006.01)
*H04N 5/369* (2011.01)
(Continued)

(52) U.S. Cl.
CPC .. *H01L 27/14647* (2013.01); *H01L 27/14621* (2013.01); *H01L 27/14627* (2013.01);
(Continued)

(58) Field of Classification Search
CPC ......... H01L 27/14647; H01L 27/14687; H01L 27/14621; H01L 27/14627;
(Continued)

(56) References Cited

U.S. PATENT DOCUMENTS

| 4,654,536 A * | 3/1987 | Saito ................. H01L 27/14603 250/208.1 |
| 2015/0195466 A1* | 7/2015 | Takase ................. H04N 5/369 348/294 |

(Continued)

FOREIGN PATENT DOCUMENTS

| JP | H02-58381 A | 2/1990 |
| JP | 10-115552 A | 5/1998 |

(Continued)

OTHER PUBLICATIONS

International Search Report prepared by the Japan Patent Office dated Dec. 25, 2015, for International Application No. PCT/JP2015/079820.

*Primary Examiner* — Nelson Garces
(74) *Attorney, Agent, or Firm* — Sheridan Ross P.C.

(57) ABSTRACT

A more preferable pixel for detecting a focal point may be formed by using a photoelectric converting film. A solid-state image sensor includes a first pixel including a photoelectric converting unit formed of a photoelectric converting film and first and second electrodes which interpose the same from above and below in which at least one of the first and second electrodes is a separated electrode separated for each pixel, and a second pixel including the photoelectric converting unit in which the separated electrode is formed to have a planar size smaller than that of the first pixel and a third electrode extending at least to a boundary of the pixel is formed in a region which is vacant due to a smaller planar (Continued)

size. The present disclosure is applicable to the solid-state image sensor and the like, for example.

14 Claims, 26 Drawing Sheets

(51) Int. Cl.
  *H04N 9/04* (2006.01)
  *H01L 27/30* (2006.01)
(52) U.S. Cl.
  CPC .. *H01L 27/14636* (2013.01); *H01L 27/14665* (2013.01); *H01L 27/14687* (2013.01); *H04N 5/3696* (2013.01); *H04N 9/045* (2013.01); *H01L 27/14623* (2013.01); *H01L 27/14692* (2013.01); *H01L 27/307* (2013.01)
(58) Field of Classification Search
  CPC ........... H01L 27/14636; H01L 27/146–14893; H04N 5/3696; H04N 9/045; H04N 5/369; H04N 5/36961

USPC .................................................. 257/429–435
  See application file for complete search history.

(56) References Cited

U.S. PATENT DOCUMENTS

| | | | |
|---|---|---|---|
| 2015/0255498 A1* | 9/2015 | Sugiura | H01L 27/14621 257/432 |
| 2015/0372036 A1* | 12/2015 | Suh | H01L 27/1462 348/273 |

FOREIGN PATENT DOCUMENTS

| | | |
|---|---|---|
| JP | H11-97664 A | 4/1999 |
| JP | 2001-284562 A | 10/2001 |
| JP | 2011-29337 A | 2/2011 |
| JP | 2011-210748 A | 10/2011 |
| JP | 2011-216701 A | 10/2011 |

* cited by examiner

SOLID-STATE IMAGE SENSOR WITH SEPARATED ELECTRODE, METHOD OF MANUFACTURING THE SAME, AND ELECTRONIC DEVICE

CROSS REFERENCE TO RELATED APPLICATIONS

This application is a national stage application under 35 U.S.C. 371 and claims the benefit of PCT Application No. PCT/JP2015/079820 having an international filing date of 22 Oct. 2015, which designated the United States, which PCT application claimed the benefit of Japanese Patent Application No. 2014-225190 filed 5 Nov. 2014, the disclosures of which are incorporated herein by reference in their entirety.

TECHNICAL FIELD

The present disclosure relates to a solid-state image sensor, a method of manufacturing the same, and an electronic device, and especially relates to the solid-state image sensor capable of forming a more preferable pixel for detecting a focal point by using a photoelectric converting film, the method of manufacturing the same, and the electronic device.

BACKGROUND ART

A solid-state image sensor in which a semiconductor is used is mounted on many devices such as a digital camera, a video camera, a monitoring camera, a copying machine, and a fax machine. Recently, a so-called CMOS image sensor manufactured by a complementary metal oxide semiconductor (CMOS) process together with a peripheral circuit is often used as the solid-state image sensor.

There is the CMOS image sensor in which a method of using pixels for detecting a focal point with sensitivities asymmetrical with respect to a light incident angle is adopted as an automatic focusing function of a camera. For example, in Patent Document 1, a photodiode in a pixel is divided into two and one of them with a smaller area is used for detecting a focal point as a method of realizing the pixel for detecting a focal point.

Also, recently, an image sensor in which an organic semiconductor and an inorganic compound semiconductor are used as a photoelectric converting film is developed. This generally has an element structure including the photoelectric converting film and electrodes interposing the same from above and below in which at least one of the upper and lower electrodes is separated for each pixel. Herein also, a method of using the pixel for detecting a focal point is suggested.

In Patent Document 2, an organic photoelectric converting element also having a color filter function arranged with the same optical path length as a silicon photodiode of a certain pixel is divided into two in the pixel and used as a pair, and according to this, light with different phase difference is detected and a focal point may be detected. Patent Document 3 enables focal point detection by using a pair of pixels provided with a light shielding film on a light incident side in an organic photoelectric converting element for detecting phase difference.

CITATION LIST

Patent Document

Patent Document 1: Japanese Patent Application Laid-Open No. 2012-37777

Patent Document 2: Japanese Patent Application Laid-Open No. 2013-145292

Patent Document 3: Japanese Patent Application Laid-Open No. 2014-67948

SUMMARY OF THE INVENTION

Problems to be Solved by the Invention

However, since a photoelectric converting film for detecting a focal point also serves as color filters in Bayer arrangement in the method of realizing in Patent Document 2, it is required to separate the photoelectric converting film for each pixel. Therefore, dark current due to separation of the photoelectric converting film might be deteriorated.

In the realizing method in Patent Document 3 in which the light shielding film is used, when a photodiode is provided on a silicon layer below a photoelectric converting film, light received there is also shielded and an obtained signal becomes smaller.

The present disclosure is achieved in view of such a condition, and an object thereof is to form a more preferable pixel for detecting a focal point by using the photoelectric converting film.

Solutions to Problems

A solid-state image sensor according a first aspect of the present disclosure is provided with a first pixel including a photoelectric converting unit formed of a photoelectric converting film and first and second electrodes which interpose the photoelectric converting film from above and below in which at least one of the first and second electrodes is a separated electrode separated for each pixel, and a second pixel including the photoelectric converting unit in which the separated electrode is formed to have a planar size smaller than the planar size of the separated electrode of the first pixel and a third electrode extending at least to a boundary of the pixel is formed in a region which is vacant due to a smaller planar size.

A method of manufacturing a solid-state image sensor according to a second aspect of the present disclosure forms a first pixel including a photoelectric converting unit formed of a photoelectric converting film and first and second electrodes which interpose the photoelectric converting film from above and below in which at least one of the first and second electrodes is a separated electrode separated for each pixel, and a second pixel including the photoelectric converting unit in which the separated electrode is formed to have a planar size smaller than the planar size of the separated electrode of the first pixel and a third electrode extending at least to a boundary of the pixel is formed in a region which is vacant due to a smaller planar size.

An electronic device according to a third aspect of the present disclosure is provided with a solid-state image sensor including a first pixel including a photoelectric converting unit formed of a photoelectric converting film and first and second electrodes which interpose the photoelectric converting film from above and below in which at least one of the first and second electrodes is a separated electrode separated for each pixel, and a second pixel including the photoelectric converting unit in which the separated electrode is formed to have a planar size smaller than the planar size of the separated electrode of the first pixel and a third electrode extending at least to a boundary of the pixel is formed in a region which is vacant due to a smaller planar size.

In the first to third aspects of the present disclosure, a first pixel including a photoelectric converting unit formed of a photoelectric converting film and first and second electrodes which interpose the photoelectric converting film from above and below in which at least one of the first and second electrodes is a separated electrode separated for each pixel, and a second pixel including the photoelectric converting unit in which the separated electrode formed to have a planar size smaller than the planar size of the separated electrode of the first pixel and a third electrode extending at least to a boundary of the pixel is formed in a region which is vacant due to a smaller planar size are provided.

The solid-state image sensor and the electronic device may be independent devices or may be modules incorporated in other devices.

Effects of the Invention

According to the first to third aspects of the present disclosure, a more preferable pixel for detecting a focal point may be formed by using a photoelectric converting film.

Meanwhile, the effect is not especially limited to the effects described herein; this may also any effect described in the present disclosure.

MODE FOR CARRYING OUT THE INVENTION

A mode for carrying out the present disclosure (hereinafter, referred to as an embodiment) is hereinafter described. Meanwhile, the description is given in the following order.

1. Schematic Configuration Example of Solid-State Image Sensor
2. First Embodiment of Pixel (Configuration in Which Each of Pair of Phase Difference Pixels Includes Dummy Pixel)
3. Second Embodiment of Pixel (Configuration in Which Pair of Phase Difference Pixels Includes Shared Dummy Pixel)
4. Third Embodiment of Pixel (Configuration in Which Element Separating Electrode Is Extended to Phase Difference Pixel)
5. Fourth Embodiment of Pixel (First Configuration in Which Photoelectric Converting Film Receives Light of All Wavelengths)
6. Fifth Embodiment of Pixel (Second Configuration in Which Photoelectric Converting Film Receives Light of All Wavelengths)
7. Sixth Embodiment of Pixel (Third Configuration in Which Photoelectric Converting Film Receives Light of All Wavelengths)
8. Manufacturing Method of First Embodiment
9. Application Example to Electronic Device 1. Schematic Configuration Example of Solid-State Image Sensor FIG. 1 illustrates a schematic configuration of a solid-state image sensor according to the present disclosure.

Figure 1:
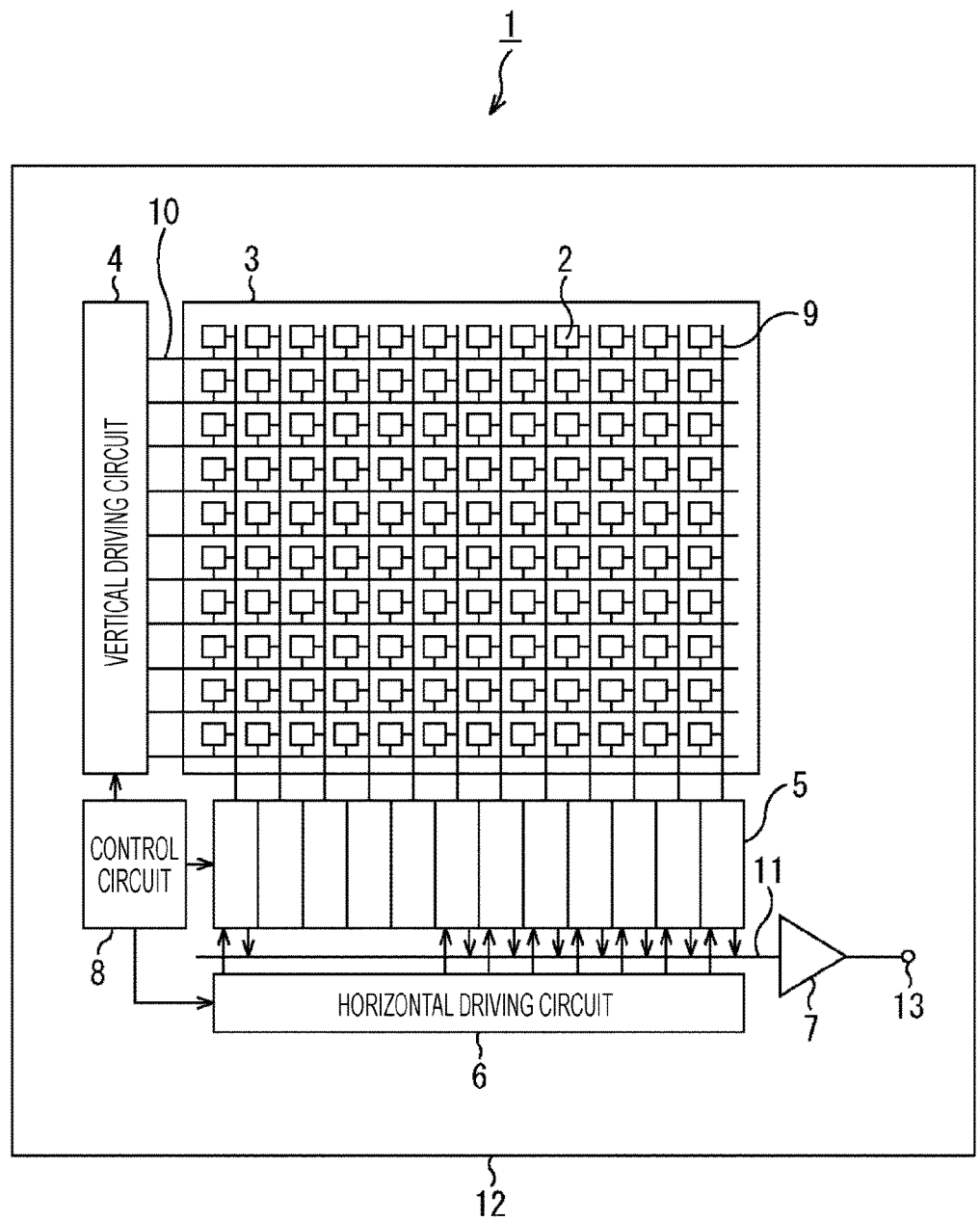
FIG. 1 is a view illustrating a schematic configuration of a solid-state image sensor according to the present disclosure.

A solid-state image sensor 1 in FIG. 1 includes a pixel array unit 3 obtained by arranging pixels 2 in a two-dimensional manner to form a matrix on a semiconductor substrate 12 formed of silicon (Si), for example, as a semiconductor, and a peripheral circuit unit around the same. The peripheral circuit unit includes a vertical driving circuit 4, a column signal processing circuit 5, a horizontal driving circuit 6, an output circuit 7, a control circuit 8 and the like.

The pixels 2 arranged in a two-dimensional manner to form a matrix in the pixel array unit 3 include a normal pixel 2X which generates a signal for generating an image and a phase difference pixel 2P which generates a signal for detecting a focal point as described later with reference to FIG. 3 and the like. There also is a case in which a dummy pixel 2D is arranged adjacent to the phase difference pixel 2P.

The vertical driving circuit 4 formed of a shift register, for example, selects pixel driving wiring 10, supplies a pulse for driving the pixel 2 to the selected pixel driving wiring 10, and drives the pixels 2 in a row unit. That is to say, the vertical driving circuit 4 sequentially selects to scan the pixels 2 in the pixel array unit 3 in a row unit in a vertical direction and supplies a pixel signal based on a signal charge generated according to a light receiving amount by a photoelectric converting unit of each pixel 2 to the column signal processing circuit 5 through a vertical signal line 9.

The column signal processing circuit 5 arranged for each column of the pixels 2 performs signal processing such as noise removal on the signals output from the pixels 2 of one row for each pixel column. For example, the column signal processing circuit 5 performs the signal processing such as correlated double sampling (CDS) for removing a fixed pattern noise specific to the pixel and AD conversion.

The horizontal driving circuit 6 formed of a shift register, for example, sequentially selects the column signal processing circuits 5 by sequentially outputting horizontal scanning pulses and outputs the pixel signal from each of the column signal processing circuits 5 to a horizontal signal line 11.

The output circuit 7 performs predetermined signal processing on the signals sequentially supplied from the column signal processing circuits 5 through the horizontal signal line 11 to output through an output terminal 13. There is a case in which the output circuit 7 merely buffers, for example, or a case in which this performs black level adjustment, column variation correction, and various types of digital signal processing.

The control circuit 8 receives an input clock and data which designates an operation mode and the like, and also outputs data such as internal information of the solid-state image sensor 1. That is, the control circuit 8 generates a clock signal and a control signal which serve as a reference for operation of the vertical driving circuit 4, the column signal processing circuit 5, the horizontal driving circuit 6 and the like on the basis of a vertical synchronization signal, a horizontal synchronization signal, and a master clock. The control circuit 8 then outputs the generated clock signal and control signal to the vertical driving circuit 4, the column signal processing circuit 5, the horizontal driving circuit 6, and the like.

The solid-state image sensor 1 configured in the above-described manner is a so-called column AD type CMOS image sensor in which the column signal processing circuit 5 which performs the CDS processing and AD conversion processing is arranged for each pixel column.

2. First Embodiment of Pixel

<Cross-Sectional Configuration of Normal Pixel>

A cross-sectional configuration of a normal pixel of a solid-state image sensor 1 is described with reference to FIG. 2.

Figure 2:
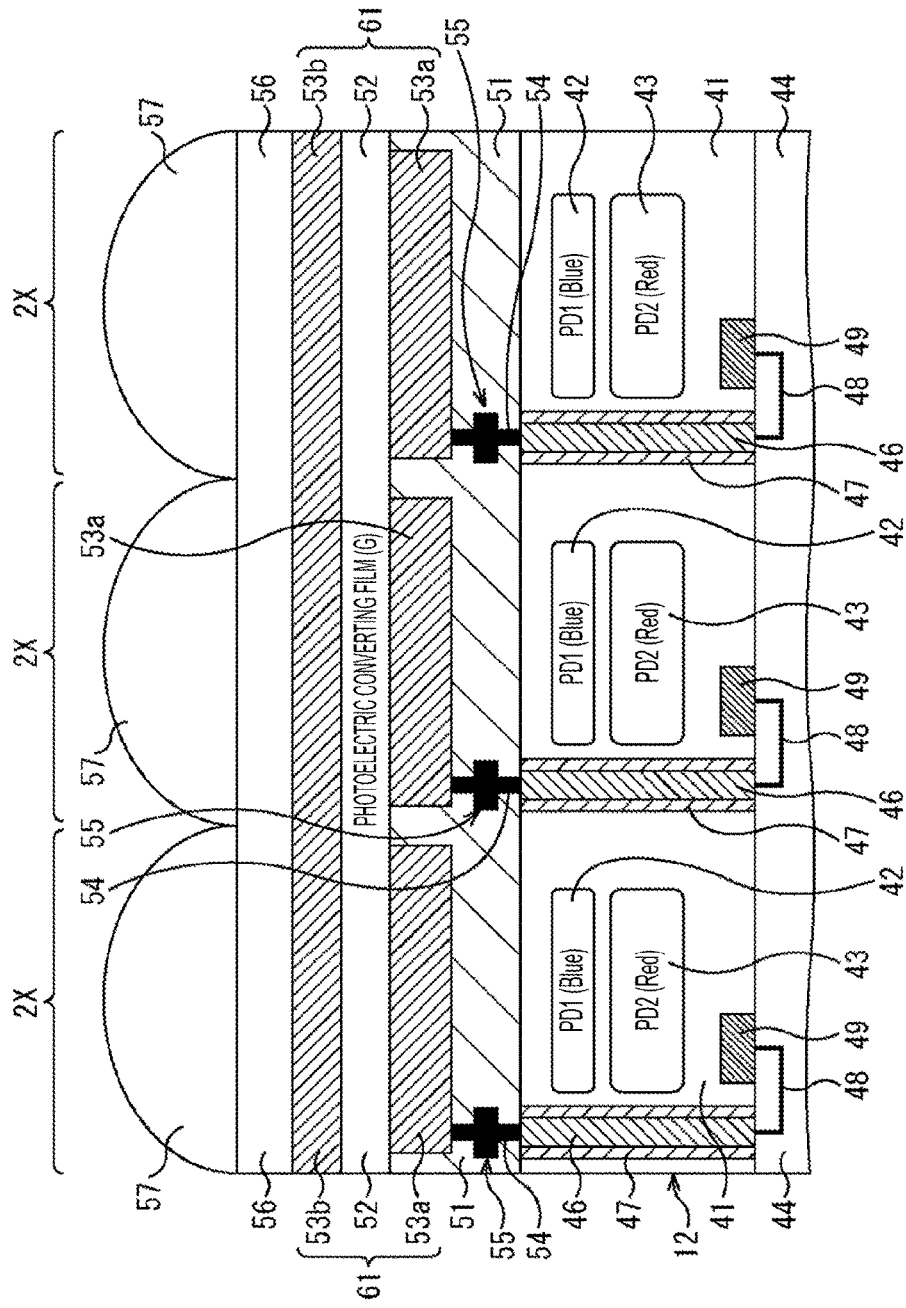
FIG. 2 is a cross-sectional configuration diagram illustrating a cross-sectional configuration of a normal pixel.

FIG. 2 is a view illustrating the cross-sectional configuration of a normal pixel 2X of the solid-state image sensor 1 in FIG. 1.

Photodiodes PD1 and PD2 by PN junction are formed in a depth direction by forming second conductivity type (for example, N-type) semiconductor regions 42 and 43 so as to be stacked in the depth direction in a first conductivity type (for example, P-type) semiconductor region 41 of a semiconductor substrate 12. The photodiode PD1 including the semiconductor region 42 as a charge accumulation region is an inorganic photoelectric converting unit which receives blue light to perform photoelectric conversion, and the photodiode PD2 including the semiconductor region 43 as a charge accumulation region is an inorganic photoelectric converting unit which receives red light to perform the photoelectric conversion.

A plurality of pixel transistors which reads the charges accumulated in the photodiodes PD1 and PD2 and a multi-layer wiring layer 44 formed of a plurality of wiring layers and an interlayer insulating film are formed on a surface side (lower side in the drawing) of the semiconductor substrate 12. Meanwhile, the multi-layer wiring layer 44 is not illustrated in detail in FIG. 2. A plurality of pixel transistors is formed of four MOS transistors which are a transfer transistor, a selection transistor, a reset transistor, and an amplification transistor, for example.

A conductive plug 46 for extracting the charge obtained by the photoelectric conversion by a photoelectric converting film 52 to be described later to a side of the multi-layer wiring layer 44 is formed on the semiconductor substrate 12 so as to penetrate (the semiconductor region 41 of) the semiconductor substrate 12. An SiO2 or SiN insulating film 47 is formed on an outer periphery of the conductive plug 46 so as to inhibit short-circuit with the semiconductor region 41.

The conductive plug 46 is connected to a floating diffusion unit (FD unit) 49 formed of a second conductivity type (for example, N-type) semiconductor region in the semiconductor substrate 12 by means of metal wiring 48 formed in the multi-layer wiring layer 44. The FD unit 49 is a region in which the charge obtained by the photoelectric conversion by the photoelectric converting film 52 is temporarily held before being read. The charge held in the FD unit 49 is output to the column signal processing circuit 5 on a subsequent stage through the amplification transistor and the like as is the case with the charges generated by the photodiodes PD1 and PD2. However, the transfer transistor required in the photodiodes PD1 and PD2 is not required when the charge generated by the photoelectric converting film 52 is output as a signal. Therefore, the photoelectric conversion using the photoelectric converting film 52 has an advantage that light receiving areas of the photodiodes PD1 and PD2 are not narrowed.

A transparent insulating film 51 formed of two or three layers of a hafnium oxide (HfO2) film and a silicon oxide film is formed, for example, on an interface on a rear surface side (upper side in the drawing) of the semiconductor substrate 12.

The photoelectric converting film 52 is arranged above the transparent insulating film 51 so as to be interposed between a lower electrode 53a below the same and an upper electrode 53b above the same. Out of a region in which the photoelectric converting film 52 is formed, a region interposed between the lower electrode 53a and the upper electrode 53b is the region in which incident light is subjected to the photoelectric conversion; the photoelectric converting film 52, the lower electrode 53a, and the upper electrode 53b form a photoelectric converting unit 61. As a film which performs the photoelectric conversion on green wavelength light, the photoelectric converting film 52 is formed of an organic photoelectric converting material containing a rhodamine dye, a merocyanine dye, or quinacridone, for example. The lower electrode 53a and the upper electrode 53b are formed of an indium tin oxide (ITO) film, an indium zinc oxide film and the like, for example.

Meanwhile, in a case in which the photoelectric converting film 52 is a film which performs the photoelectric conversion on red wavelength light, an organic photoelectric converting material containing a phthalocyanine dye may be used, for example. Also, in a case of the film which performs the photoelectric conversion on blue wavelength light, an organic photoelectric converting material containing a coumarin dye, tris(8-hydroxyquinoline) aluminum (Alq3), the merocyanine dye and the like may be used.

Although the upper electrode 53b is formed on an entire surface so as to be shared by all the pixels, the lower electrode 53a is formed for each pixel and is connected to the conductive plug 46 of the semiconductor substrate 12 by means of metal wiring 54 penetrating the transparent insulating film 51. The metal wiring 54 formed of materials such as tungsten (W), aluminum (Al), and copper (Cu) is also formed in a planar direction at predetermined depth of the transparent insulating film 51 and also serves as an interpixel light shielding film 55 which inhibits the light from entering an adjacent pixel.

A high refractive index layer 56 is formed of an inorganic film such as a silicon nitride film (SiN), silicon oxynitride film (SiON), and silicon carbide (SiC) on an upper surface of the upper electrode 53b. Also, an on-chip lens 57 is formed above the high refractive index layer 56. The silicon nitride film (SiN) or a resin material such as a styrene resin, an acrylic resin, a styrene acrylic copolymer resin, or a siloxane resin, for example, is used as a material of the on-chip lens 57. In this pixel structure, since a distance between the photoelectric converting film 52 and the on-chip lens 57 is short, light incident angle dependency is smaller in a phase difference pixel 2P, so that the high refractive index layer 56 has an effect of enlarging a refraction angle and improving light condensing efficiency.

In FIG. 2, three normal pixels 2X configured in the above-described manner are arranged side by side.

The solid-state image sensor 1 in which the normal pixels 2X formed in this manner are arranged in a two-dimensional manner is a rear surface irradiation type CMOS solid-state image sensor in which the light enters from a rear surface side on an opposite side of the surface side of the semiconductor substrate 12 on which the multi-layer wiring layer 44 is formed.

Also, the solid-state image sensor 1 is a longitudinal direction spectral solid-state image sensor which performs the photoelectric conversion by the photoelectric converting film 52 formed above the semiconductor substrate (silicon layer) 12 on the green light and performs the photoelectric conversion by the photodiodes PD1 and PD2 in the semiconductor substrate 12 on the blue light and red light.

<Planar Layout of Lower Electrode>

Figure 3:
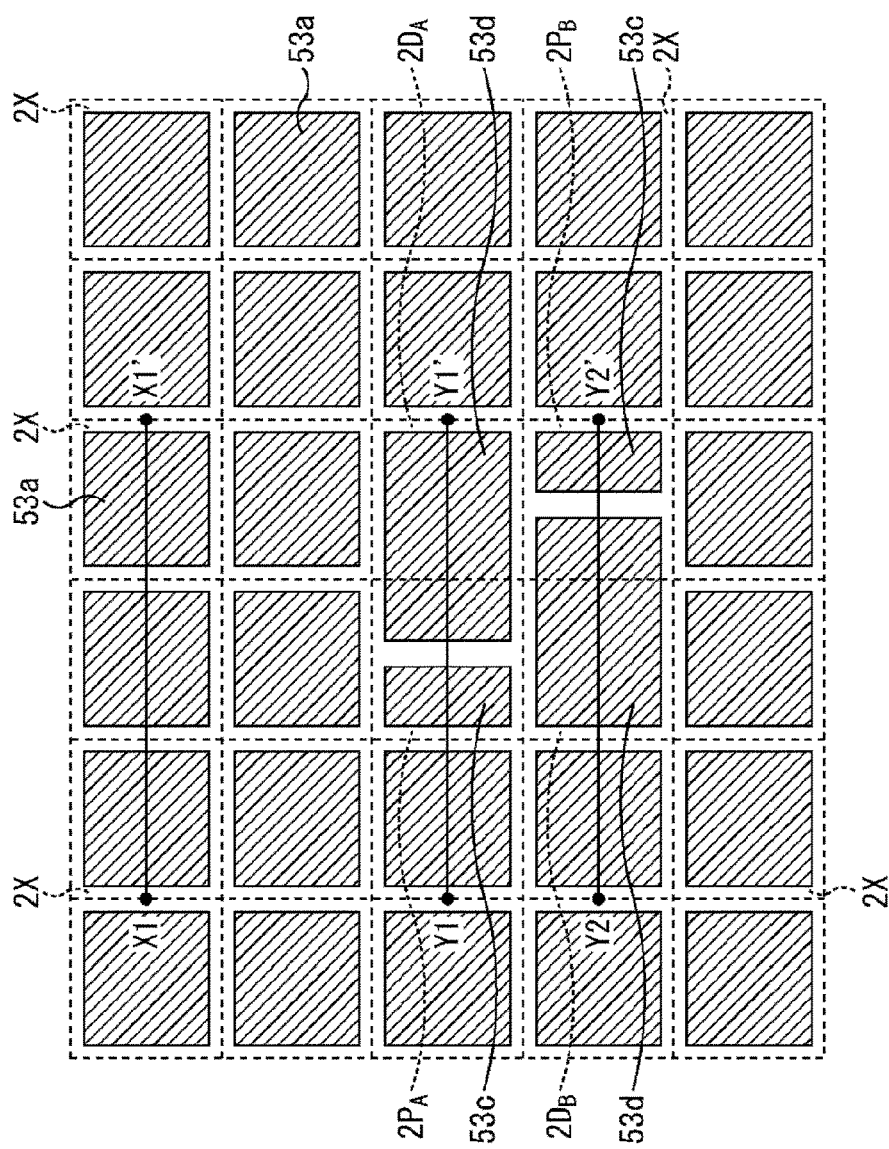
FIG. 3 is a view illustrating a planar layout of a lower electrode of a first embodiment.

FIG. 3 is a view illustrating a planar layout of the lower electrode in the pixel array unit 3.

As illustrated in FIG. 3, out of the pixels 2 arranged in a two-dimensional manner in the pixel array unit 3, in the normal pixel 2X, the lower electrode 53a is formed for each pixel. The cross-sectional view illustrated in FIG. 2 corresponds a cross-sectional view of a portion in which the three normal pixels 2X are arranged in a horizontal direction indicated by line X1-X1' in FIG. 3, for example.

On the other hand, the pixels 2 arranged in a two-dimensional manner in the pixel array unit 3 include the pixel 2 including a lower electrode 53c a planar size of which is made smaller than that of the lower electrode 53a of the normal pixel 2X and the pixel 2 including a lower electrode 53d enlarged to a region which is vacant due to a decrease in size of the lower electrode 53c.

The pixel 2 including the downsized lower electrode 53c is the phase difference pixel 2P which generates a signal for detecting a focal point and the pixel 2 including the enlarged lower electrode 53d is a dummy pixel 2D arranged adjacent to the phase difference pixel 2P.

A pair (two) of the phase difference pixels 2P configured such that sensitivities are asymmetrical with respect to a light incident angle is arranged in the pixel array unit 3. The two phase difference pixels 2P which form a pair are represented as a type A phase difference pixel $2P_A$ and a type B phase difference pixel $2P_B$. Also, the dummy pixel 2D arranged adjacent to the phase difference pixel $2P_A$ is represented as a dummy pixel $2D_A$ and the dummy pixel 2D arranged adjacent to the phase difference pixel $2P_B$ is represented as a dummy pixel $2D_B$.

In an example in FIG. 3, the phase difference pixel $2P_A$ is the pixel in which the lower electrode 53c is formed so as to receive light only by a left side in the pixel as compared to the normal pixel 2X, and the phase difference pixel $2P_B$ is the pixel in which the lower electrode 53c is formed only on a right side in the pixel such that a photoelectric conversion region is symmetrical to that in the phase difference pixel $2P_A$.

Meanwhile, although a pair of the phase difference pixel $2P_A$ and the dummy pixel $2D_A$ and a pair of the phase difference pixel $2P_B$ and the dummy pixel $2D_B$ are arranged so as to be adjacent in a longitudinal direction (vertical direction) in the example in FIG. 3, they are not necessarily arranged so as to be adjacent in the longitudinal direction. For example, the pair of the phase difference pixel $2P_A$ and the dummy pixel $2D_A$ and the pair of the phase difference pixel $2P_B$ and the dummy pixel $2D_B$ may be arranged with one or more pixels interposed therebetween or arranged so as to be adjacent in a lateral direction (horizontal direction).

Also, although the lower electrodes 53c of the phase difference pixels $2P_A$ and $2P_B$ are downsized in the lateral direction (horizontal direction) as compared to the lower electrode 53a in the normal pixel 2X in the example in FIG. 3, they may also be downsized in the longitudinal direction (vertical direction). When the lower electrodes 53c of the phase difference pixels $2P_A$ and $2P_B$ are downsized in the longitudinal direction, the phase difference pixel $2P_A$ and the dummy pixel $2D_A$ are arranged so as to be adjacent in the longitudinal direction and the phase difference pixel $2P_B$ and the dummy pixel $2D_B$ are also arranged so as to be adjacent in the longitudinal direction.

Furthermore, the pair of the phase difference pixels $2P_A$ and $2P_B$ including the lower electrodes 53c downsized in the lateral direction and the pair of the phase difference pixels $2P_A$ and $2P_B$ including the lower electrodes 53c downsized in the longitudinal direction may be mixed in the pixel array unit 3.

Displacement in image occurs between the pixel signal from the phase difference pixel $2P_A$ and the pixel signal from the phase difference pixel $2P_B$ because the lower electrodes 53c are formed in different positions. It is possible to realize automatic focusing by calculating a defocusing amount by calculating a phase displacement amount from the displacement in image to adjust (move) an imaging lens.

<Cross-Sectional Configuration of Phase Difference Pixel>

Figure 4:
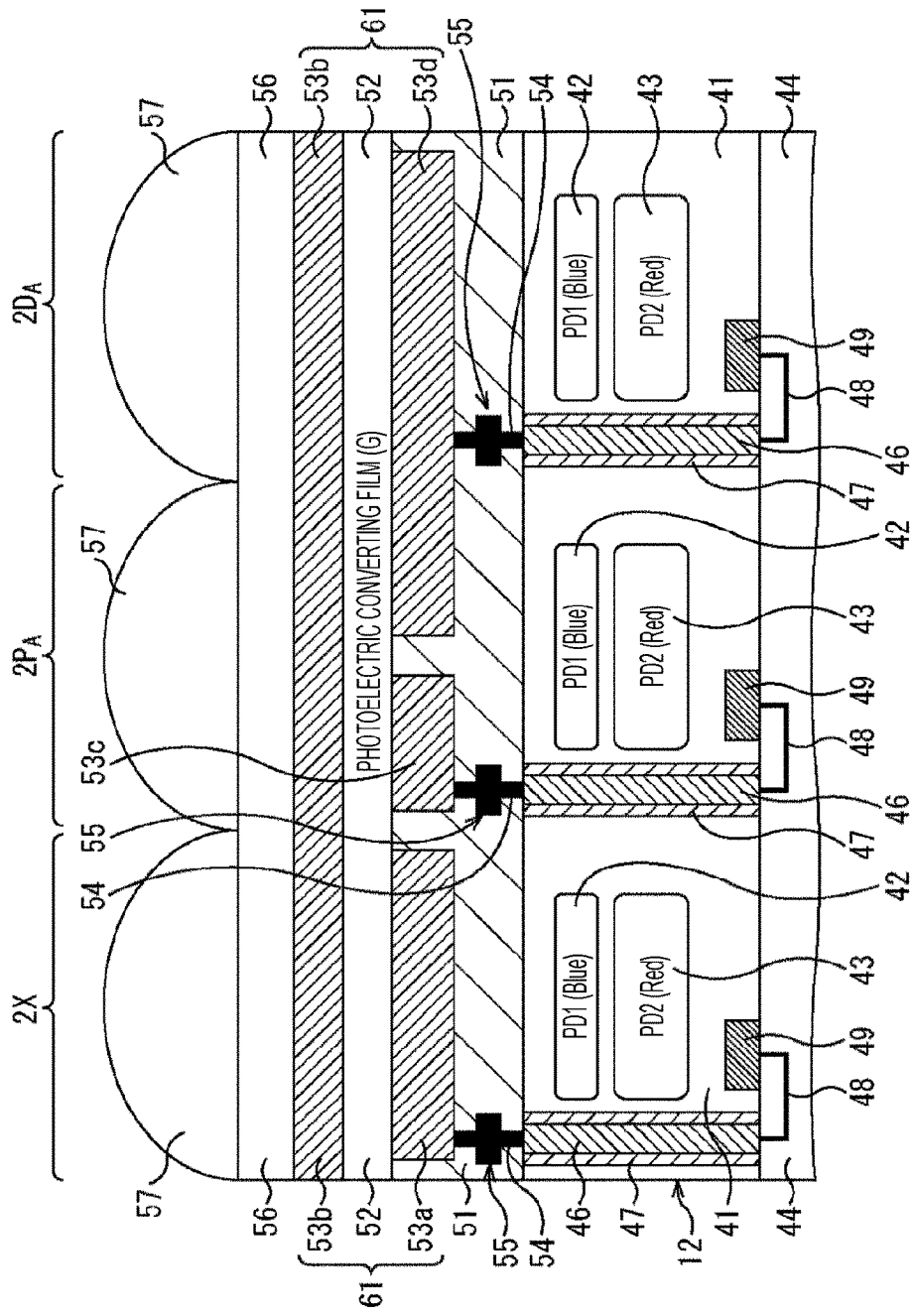
FIG. 4 is a cross-sectional configuration diagram taken along line Y1-Y1' in FIG. 3.

FIG. 4 illustrates a cross-sectional configuration taken along line Y1-Y1' in FIG. 3 in which one normal pixel 2X and the pair of the phase difference pixel $2P_A$ and the dummy pixel $2D_A$ are included.

Figure 5:
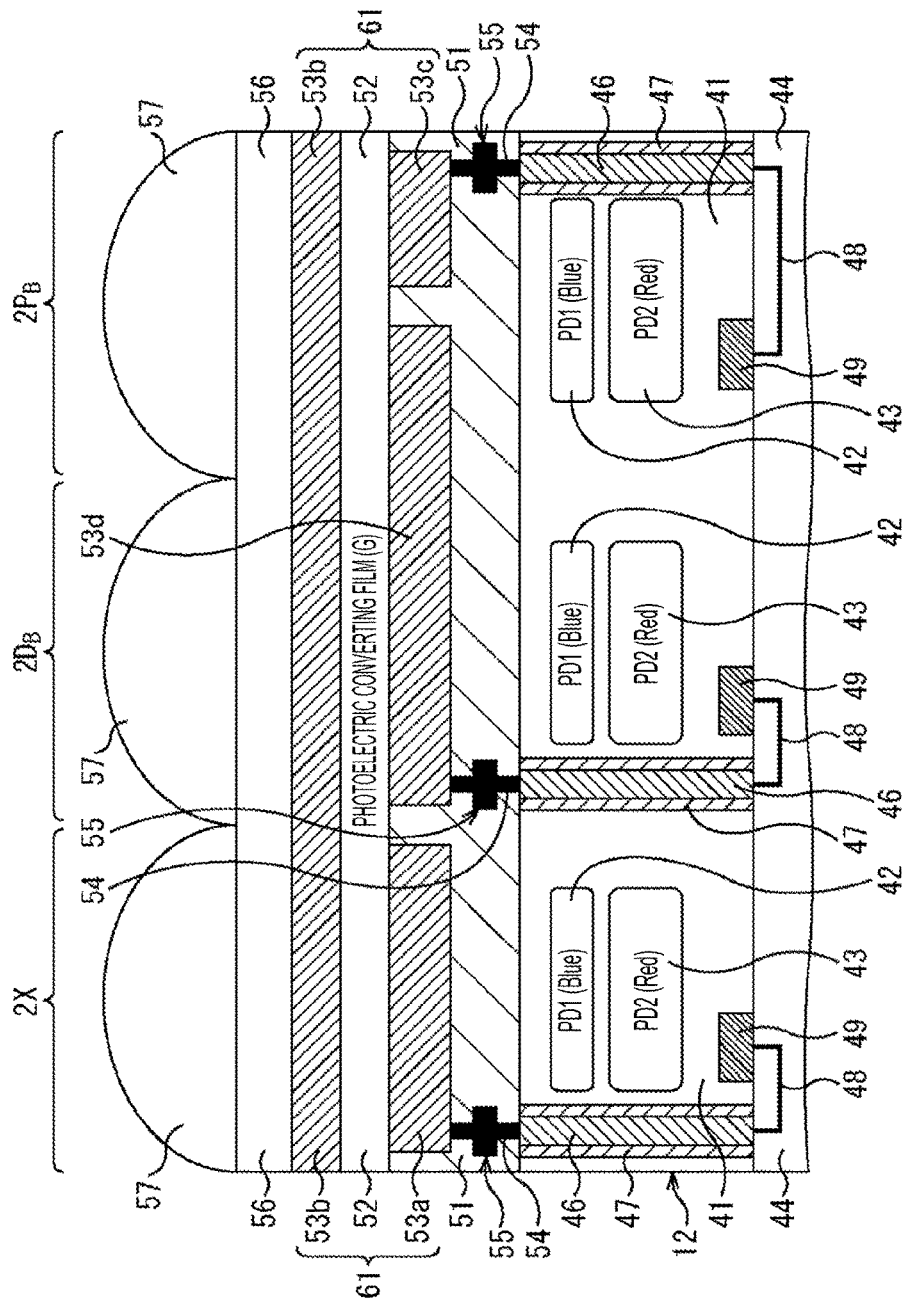
FIG. 5 is a cross-sectional configuration diagram taken along line Y2-Y2' in FIG. 3.

FIG. 5 illustrates a cross-sectional configuration taken along line Y2-Y2' in FIG. 3 in which one normal pixel 2X and the pair of the phase difference pixel $2P_B$ and the dummy pixel $2D_B$ are included.

As illustrated in FIGS. 4 and 5, the lower electrode 53c of the phase difference pixel 2P ($2P_A$ or $2P_B$) is downsized in the lateral direction (horizontal direction) as compared to the lower electrode 53a of the normal pixel 2X and the lower electrode 53d of the dummy pixel 2D ($2D_A$ or $2D_B$) is extended to a region which is vacant due to downsizing to be formed. Although an interval in the planar direction between the lower electrode 53c of the phase difference pixel 2P and the lower electrode 53d of the dummy pixel 2D is set to be the same as the interval between the lower electrodes 53a of two adjacent normal pixels 2X, they are not necessarily the same.

In the phase difference pixel 2P and the dummy pixel 2D, the configuration other than the lower electrodes 53c and 53d is similar to that of the normal pixel 2X. Therefore, B signals and R signals generated by the photodiodes PD1 and PD2 of the phase difference pixel 2P and the dummy pixel 2D may be utilized as the signals for generating an image.

A G signal generated by the photoelectric converting unit 61, that is to say, the photoelectric converting film 52, the upper electrode 53b, and the lower electrode 53c of the phase difference pixel 2P is output to the FD unit 49 through the metal wiring 54 and the conductive plug 46 to be utilized as the signal for detecting a focal point. The G signal for generating an image of the phase difference pixel 2P is calculated by interpolation from the G signals of a plurality of normal pixels 2X around the phase difference pixel 2P, for example.

On the other hand, the G signal generated by the photoelectric converting unit 61, that is to say, the photoelectric converting film 52, the upper electrode 53b, and the lower electrode 53d of the dummy pixel 2D is output to the FD unit 49 through the metal wiring 54 and the conductive plug 46, but this is discharged without being utilized. The G signal for generating an image of the dummy pixel 2D is also calculated by the interpolation from the G signals of a plurality of normal pixels 2X around the dummy pixel 2D, for example.

According to the first embodiment of the phase difference pixel 2P configured in the above-described manner, it is not required to form a light shielding film on an upper surface of the photoelectric converting film 52 for each color, so that it is possible to realize the phase difference pixel while avoiding an increase in the number of steps for forming the light shielding film. Also, it is not required to separate the photoelectric converting film 52 between the pixels, so that it is possible to inhibit dark current generated when the photoelectric converting film 52 is separated between the pixels.

Therefore, it is possible to form a more preferable phase difference pixel 2P for detecting a focal point by using the photoelectric converting film 52 formed on an outer side of the semiconductor substrate 12.

Meanwhile, in the pixel structure illustrated as the first embodiment, since the photoelectric converting film 52 performs the photoelectric conversion on the green light, the G signal output from the phase difference pixel 2P is used as the signal for detecting a focal point; however, it is possible to arbitrarily select the color of the light on which the photoelectric conversion is performed by the photoelectric converting film 52. That is to say, in the longitudinal direction spectral solid-state image sensor, it is possible to appropriately determine the color of the light on which the photoelectric conversion is performed by the photoelectric converting film 52 formed above the semiconductor substrate 12 and the colors of the light on which the photoelectric conversion is performed by the photodiodes PD1 and PD2 in the semiconductor substrate 12.

3. Second Embodiment of Pixel

<Planar Layout of Lower Electrode>

Next, a second embodiment is described. Meanwhile, in the description of the second embodiment and thereafter, the description of a portion corresponding to that in other embodiments indicated with the same reference sign as that of the above-described other embodiments is appropriately omitted and only a different portion is described. A normal pixel of the second embodiment is similar to that of the above-described first embodiment, so that only a phase difference pixel is described.

Figure 6:
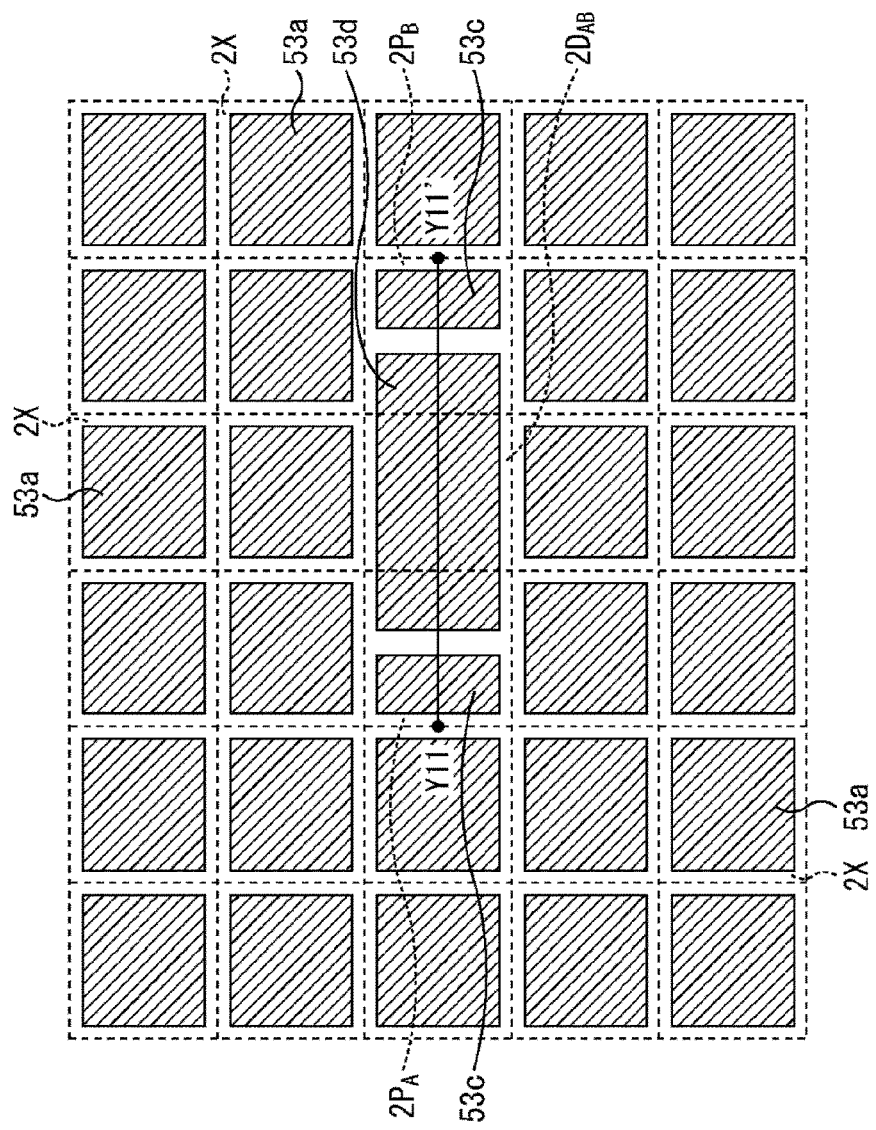
FIG. 6 is a view illustrating a planar layout of a lower electrode of a second embodiment.

FIG. 6 is a view illustrating a planar layout of a lower electrode in a pixel array unit 3.

In the second embodiment, phase difference pixels $2P_A$ and $2P_B$ are arranged in a linear manner with a dummy pixel 2D interposed therebetween. That is to say, the phase difference pixel $2P_A$, the dummy pixel 2D, and the phase difference pixel $2P_B$ are arranged in the pixel array unit 3 in this order. Therefore, the dummy pixel 2D is arranged adjacent to the phase difference pixels $2P_A$ and $2P_B$; this serves as a dummy pixel $2D_A$ arranged adjacent to the phase difference pixel $2P_A$ and a dummy pixel $2D_B$ arranged adjacent to the phase difference pixel $2P_B$. Such dummy pixel 2D is represented as a dummy pixel $2D_{AB}$.

In the second embodiment, the phase difference pixel $2P_A$ includes a lower electrode 53c formed so as to receive light only on a left side in the pixel as in the first embodiment. The phase difference pixel $2P_B$ includes the lower electrode 53c only on a right side in the pixel such that a photoelectric conversion region is symmetrical to that of the phase difference pixel $2P_A$.

Then, a lower electrode 53d of the dummy pixel $2D_{AB}$ arranged in the center is extended to regions of the phase difference pixels $2P_A$ and $2P_B$ which are vacant due to downsizing of the lower electrodes 53c to be formed. In other words, the lower electrode 53d of the dummy pixel $2D_{AB}$ is formed so as to extend to sides of the phase difference pixels $2P_A$ and $2P_B$ to lie across three pixels.

Meanwhile, although the phase difference pixel $2P_A$, the dummy pixel 2D, and the phase difference pixel $2P_B$ are arranged in a linear manner in a horizontal direction in this order in the example in FIG. 6, it is also possible to configure such that they are arranged in a linear manner in a vertical direction.

<Cross-Sectional Configuration of Phase Difference Pixel>

Figure 7:
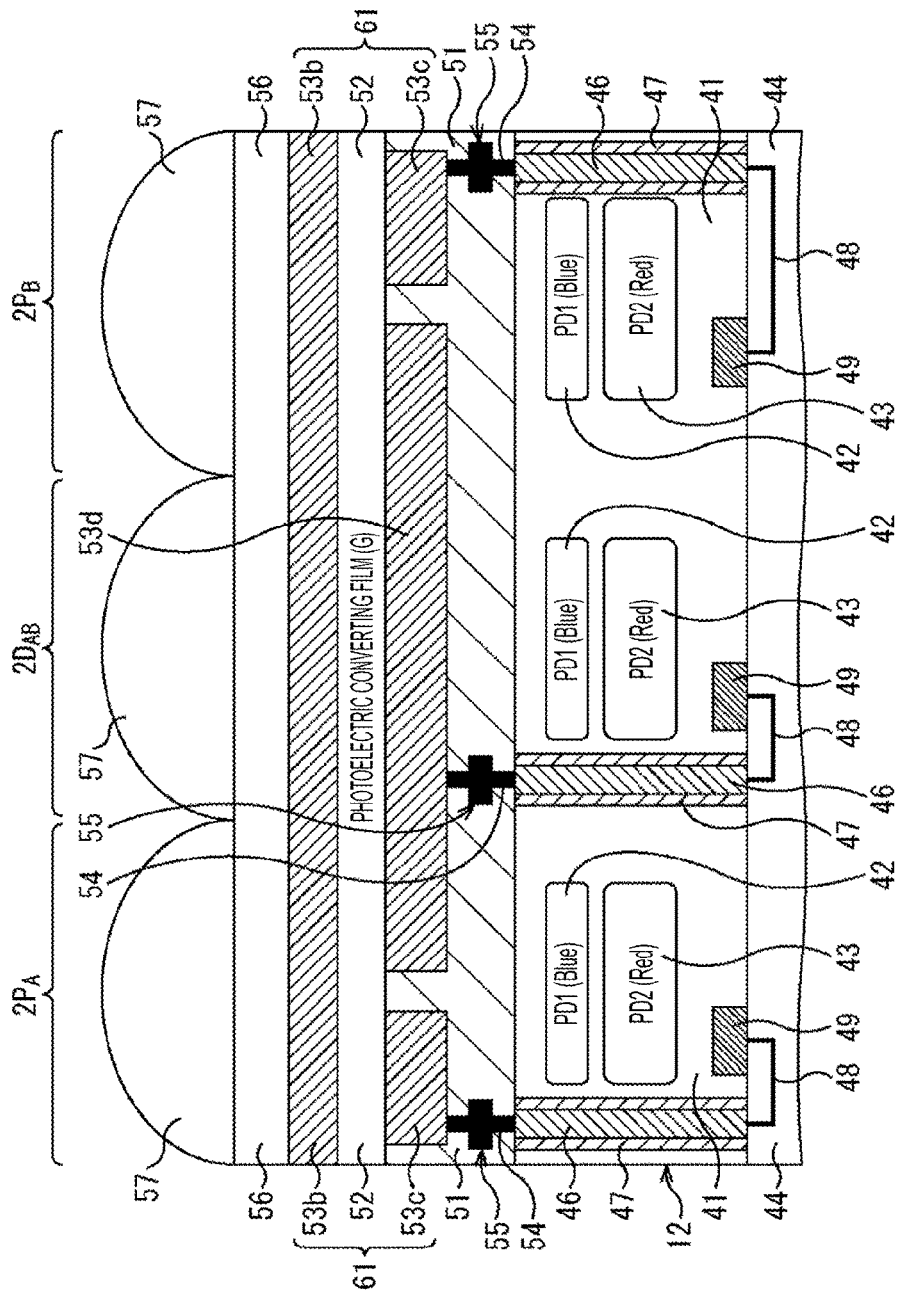
FIG. 7 is a cross-sectional configuration diagram taken along line Y11-Y11' in FIG. 6.

FIG. 7 illustrates a cross-sectional configuration taken along line Y11-Y11' in FIG. 6 including the phase difference pixel $2P_A$, the dummy pixel $2D_{AB}$, and the phase difference pixel $2P_B$.

As illustrated in FIG. 7, the lower electrodes 53c of the phase difference pixels $2P_A$ and $2P_B$ are downsized in a lateral direction (horizontal direction) as compared to a lower electrode 53a of a normal pixel 2X and the lower electrode 53d of the dummy pixel $2D_{AB}$ is extended to the regions which are vacant due to the downsizing to be formed.

In the phase difference pixels $2P_A$ and $2P_B$, a charge generated in a region interposed between an upper electrode 53b and the lower electrode 53c out of a region of a photoelectric converting film 52 is accumulated in a FD unit 49. Positions in which the lower electrodes 53c are formed in the phase difference pixels $2P_A$ and $2P_B$ are symmetrical to each other. Displacement in image occurs between pixel signals from the phase difference pixels $2P_A$ and $2P_B$ because the lower electrodes 53c are formed in different positions. It is possible to realize automatic focusing by calculating a defocusing amount by calculating a phase displacement amount from the displacement in image to adjust (move) an imaging lens.

According to the second embodiment of the phase difference pixel 2P configured in the above-described manner, it is not required to form a light shielding film on an upper surface of the photoelectric converting film 52 for each color, so that it is possible to realize the phase difference pixel while avoiding an increase in the number of steps for forming the light shielding film. Also, it is not required to separate the photoelectric converting film 52 between the pixels, so that it is possible to inhibit dark current generated when the photoelectric converting film 52 is separated between the pixels.

Therefore, it is possible to form a more preferable phase difference pixel 2P for detecting a focal point by using the photoelectric converting film 52 formed on an outer side of the semiconductor substrate 12.

4. Third Embodiment of Pixel

<Planar Layout of Lower Electrode>

Next, a third embodiment is described.

Figure 8:
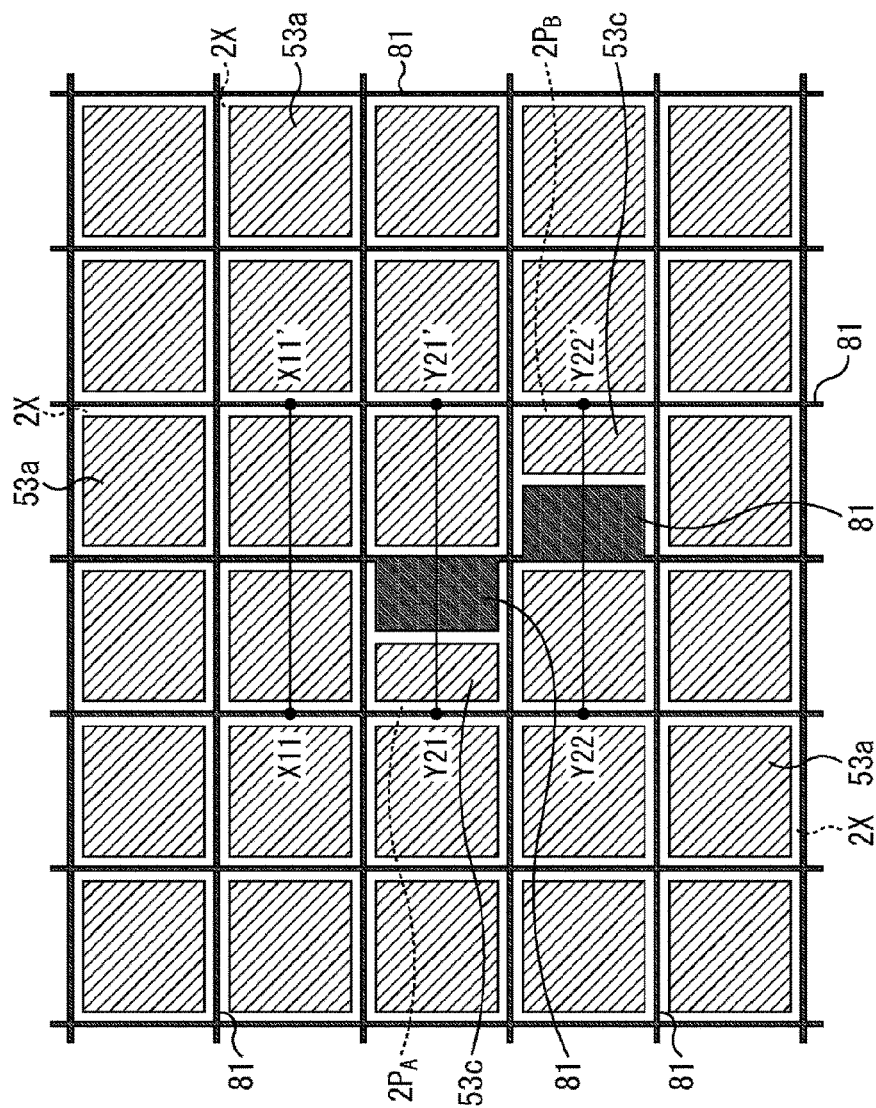
FIG. 8 is a view illustrating a planar layout of a third embodiment.

FIG. 8 is a view illustrating a planar layout of a lower electrode in a pixel array unit 3.

Meanwhile, in FIG. 8, a broken line indicating a boundary of each pixel 2 illustrated in FIGS. 3 and 6 is omitted in order to make the drawing more visible.

In the third embodiment, an element separating electrode 81 which separates pixels (elements) is formed between lower electrodes 53a and 53c adjacent to each other. A material similar to that of the lower electrodes 53a and 53c such as an indium tin oxide (ITO) film and an indium zinc oxide film, for example, may be used as a material of the element separating electrode 81. The element separating electrode 81 is formed between the lower electrodes 53a and 53c adjacent to each other in a vertical direction and in a horizontal direction, so that this is formed into a lattice shape as illustrated in FIG. 8.

Predetermined fixed potential is applied to the element separating electrode 81. According to this, it is possible to prevent capacity coupling between the adjacent pixels and inhibit an after image by collecting a charge generated between the pixels.

A phase difference pixel $2P_A$ includes the lower electrode 53c formed so as to receive light only on a left side in the pixel as in the first embodiment. The phase difference pixel $2P_B$ includes the lower electrode 53c only on a right side in the pixel such that a photoelectric conversion region is symmetrical to that of the phase difference pixel $2P_A$.

Then, the element separating electrode 81 is formed in a region which is vacant due to downsizing of the lower electrode 53c of the phase difference pixel $2P_A$ so as to be extended from a pixel boundary line. The element separating electrode 81 is formed also in a region which is vacant due to the downsizing of the lower electrode 53c of the phase difference pixel $2P_B$ so as to be extended from the pixel boundary line. That is to say, each of the phase difference pixels $2P_A$ and $2P_B$ has a configuration in which the element separating electrode 81 adjacent thereto is extended to the region which is vacant due to the downsized lower electrode 53c to be formed.

Positions in which the lower electrodes 53c are formed in the phase difference pixels $2P_A$ and $2P_B$ configured in the above-described manner are symmetrical to each other. Displacement in image occurs between pixel signals from the phase difference pixels $2P_A$ and $2P_B$ because the lower electrodes 53c are formed in different positions. It is possible to realize automatic focusing by calculating a defocusing amount by calculating a phase displacement amount from the displacement in image to adjust (move) an imaging lens.

Meanwhile, although the lower electrodes 53c of the phase difference pixels $2P_A$ and $2P_B$ are downsized in a lateral direction (horizontal direction) as compared to the lower electrode 53a of a normal pixel 2X in the example in FIG. 8, they may also be downsized in a longitudinal direction (vertical direction). In this case, the element separating electrode 81 which separates the upper and lower lower electrodes 53a and 53c is formed so as to be extended in the longitudinal direction in each of the phase difference pixels $2P_A$ and $2P_B$.

<Cross-Sectional Configuration of Pixel>

Figure 9:
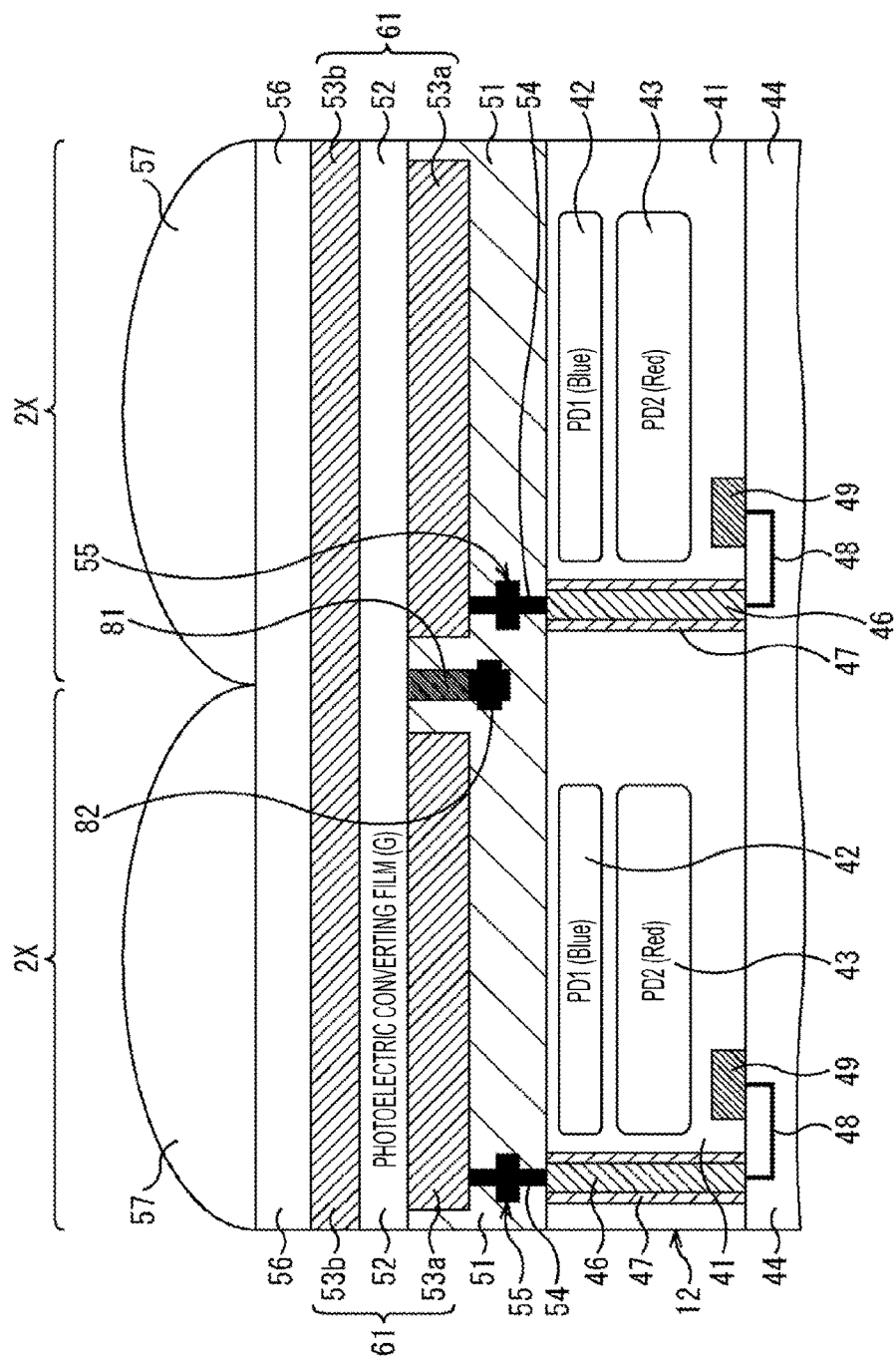
FIG. 9 is a cross-sectional configuration diagram taken along line X11-X11' in FIG. 8.

FIG. 9 is a cross-sectional configuration diagram taken along line X11-X11' in FIG. 8 including two normal pixels 2X.

Figure 10:
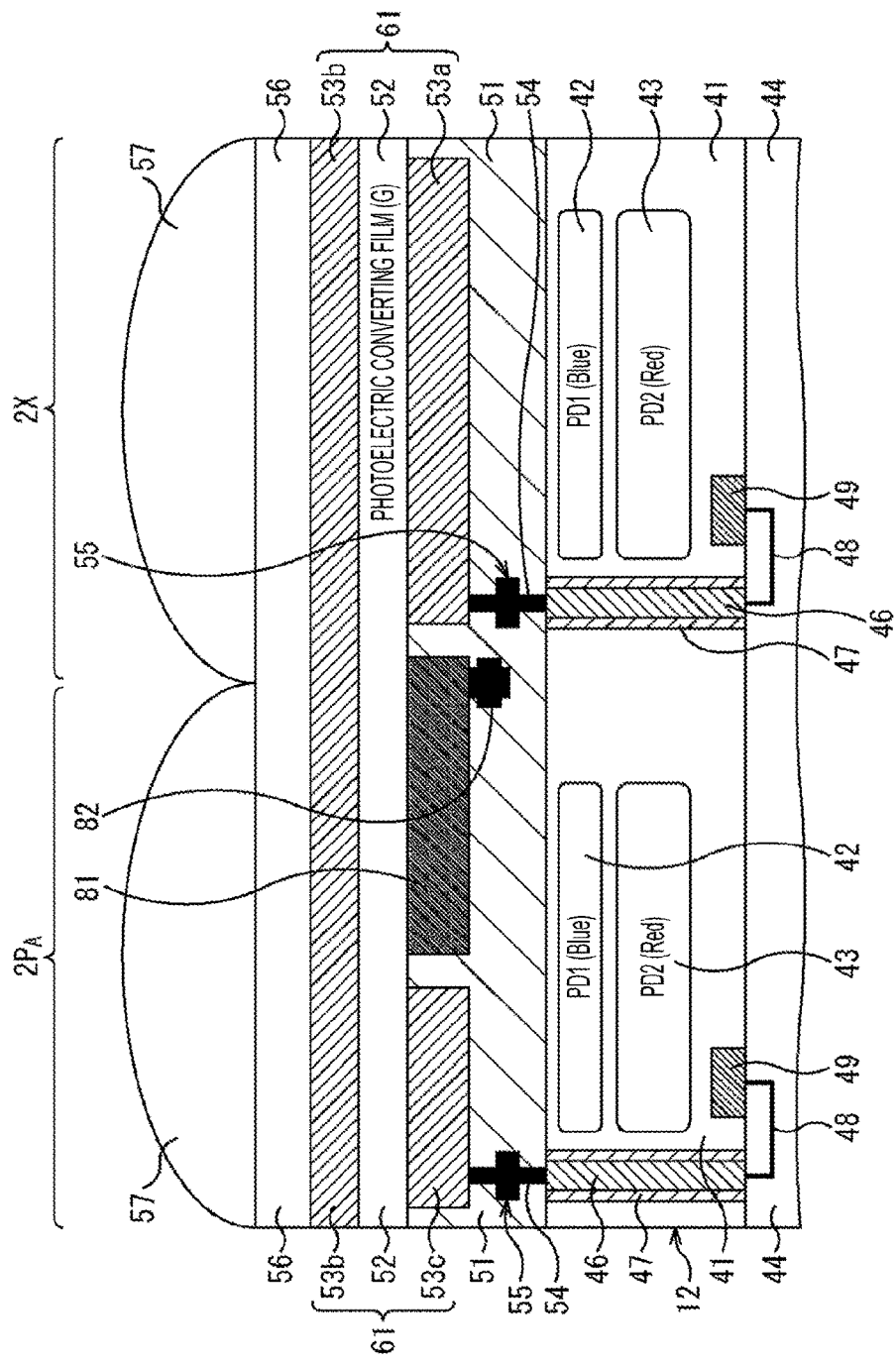
FIG. 10 is a cross-sectional configuration diagram taken along line Y21-X21' in FIG. 8.

FIG. 10 is a cross-sectional configuration diagram taken along line Y21-Y21' in FIG. 8 including one normal pixel 2X and one phase difference pixel $2P_A$.

Figure 11:
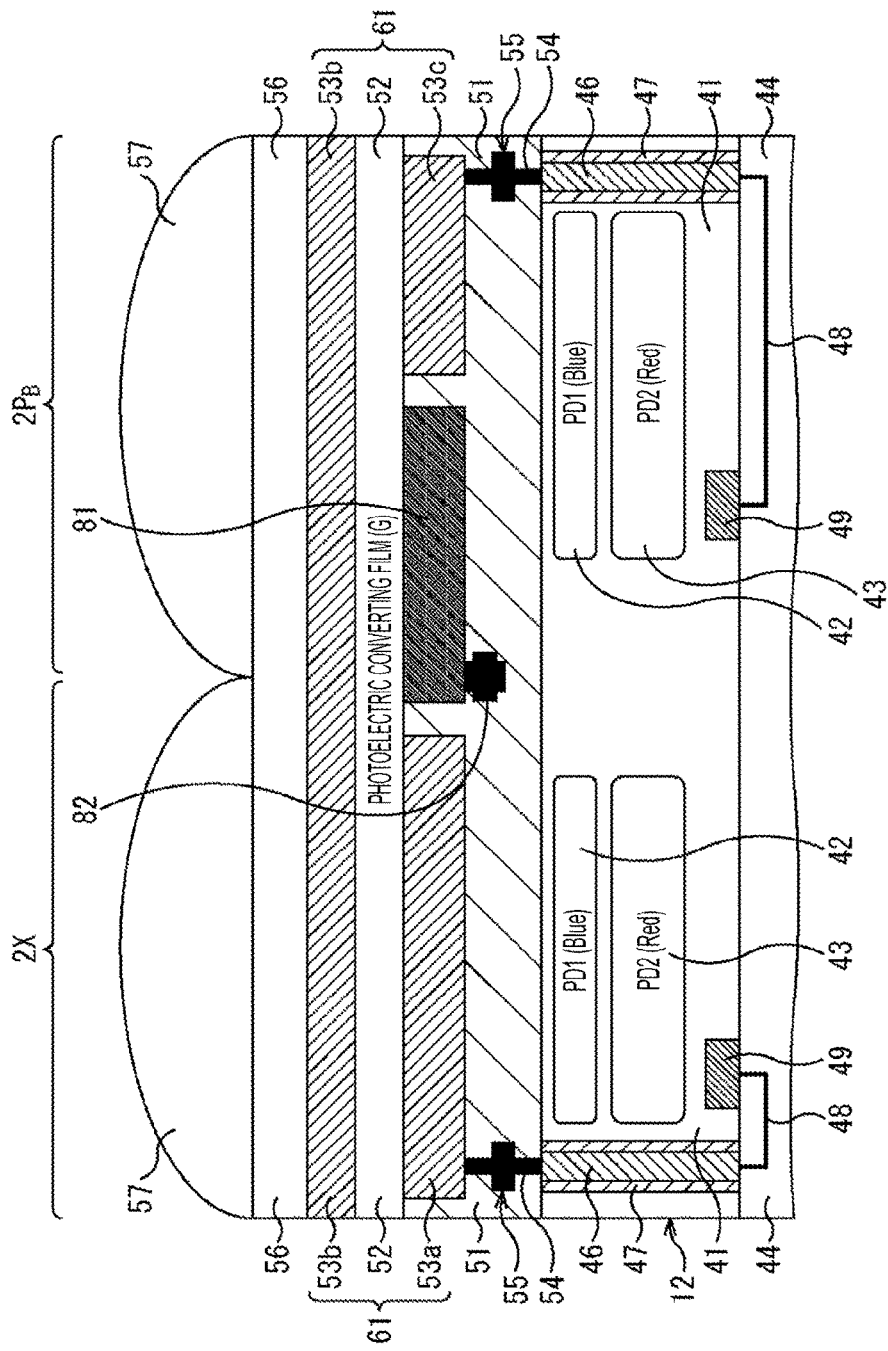
FIG. 11 is a cross-sectional configuration diagram taken along line Y22-Y22' in FIG. 8.

FIG. 11 is a cross-sectional configuration diagram taken along line Y22-Y22' in FIG. 8 including one normal pixel 2X and one phase difference pixel $2P_B$.

As illustrated in FIG. 9, in a portion in which the normal pixels 2X are adjacent to each other, the element separating electrode 81 is formed in a position on the pixel boundary in a planar direction and in the same position as that of the lower electrode 53a in a depth direction. The element separating electrode 81 is connected to metal wiring 82 formed below the same and predetermined fixed potential is applied to the element separating electrode 81 through the metal wiring 82.

As illustrated in FIG. 10, in a portion in which the phase difference pixel $2P_A$ and the normal pixel 2X are adjacent to each other, the element separating electrode 81 is formed in the region which is vacant due to the downsizing of the lower electrode 53c of the phase difference pixel $2P_A$ so as to be extended from the pixel boundary line.

Also, as illustrated in FIG. 11, in a portion in which the phase difference pixel $2P_B$ and the normal pixel 2X are adjacent to each other, the element separating electrode 81 is formed in the region which is vacant due to the downsizing of the lower electrode 53c of the phase difference pixel $2P_B$ so as to be extended from the pixel boundary line.

The extended element separating electrode 81 is connected to the metal wiring 82 formed below the same and predetermined fixed potential is applied to the element separating electrode 81 also in FIGS. 10 and 11 as in FIG. 9. The charge generated by a photoelectric converting film 52 interposed between the extended element separating electrode 81 and an upper electrode 53b is not connected to the FD unit 49 and is not extracted as a signal.

According to the third embodiment of the phase difference pixel 2P configured in the above-described manner, it is not required to form a light shielding film on an upper surface of the photoelectric converting film 52 for each color, so that it is possible to realize the phase difference pixel while avoiding an increase in the number of steps for forming the light shielding film. Also, it is not required to separate the photoelectric converting film 52 between the pixels, so that it is possible to inhibit dark current generated when the photoelectric converting film 52 is separated between the pixels.

Therefore, it is possible to form a more preferable phase difference pixel 2P for detecting a focal point by using the photoelectric converting film 52 formed on an outer side of the semiconductor substrate 12.

<Variation of Third Embodiment>

Figure 12:
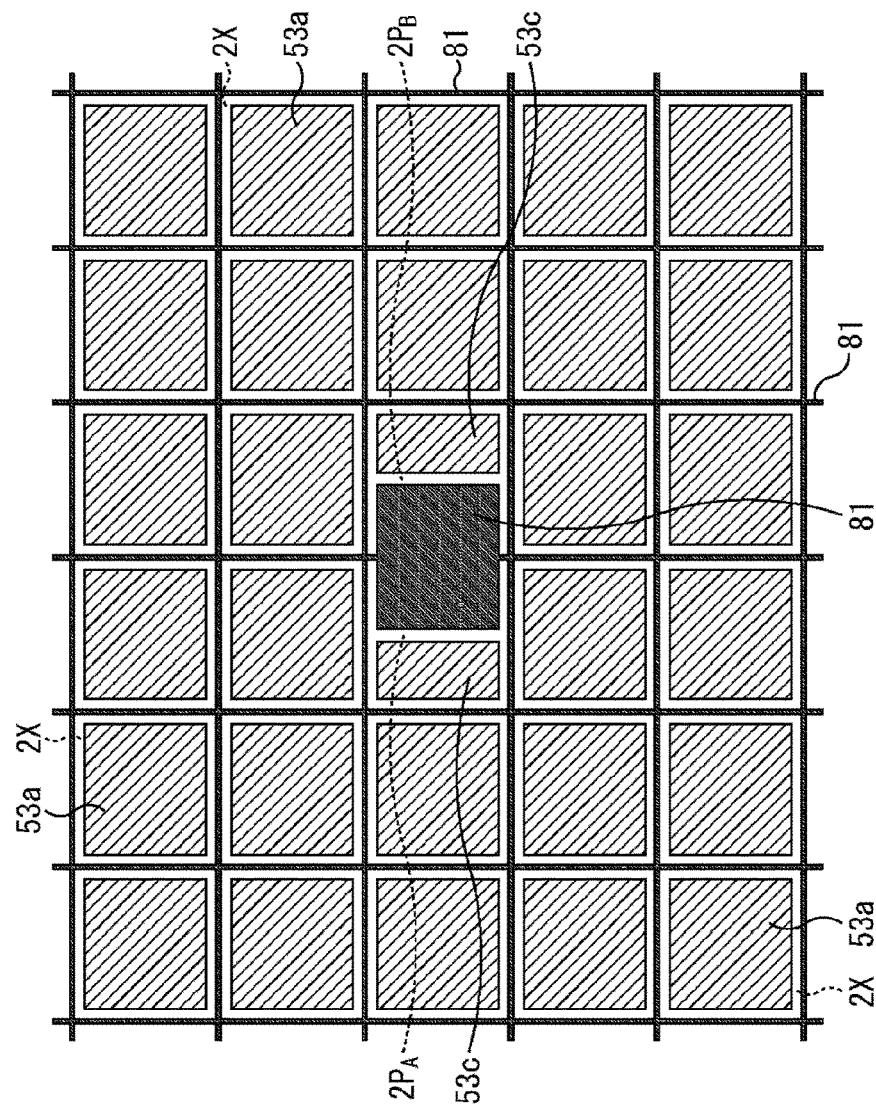
FIG. 12 is a view illustrating a variation of the third embodiment.

Although a layout is such that a normal pixel 2X is arranged adjacent to a phase difference pixel $2P_A$ or $2P_B$ in a vertical direction and in a horizontal direction in an example illustrated in FIG. 8, the layout may also be such that the phase difference pixels $2P_A$ and $2P_B$ are arranged adjacent to each other in the vertical direction or in the horizontal direction as illustrated in FIG. 12.

Figure 13:
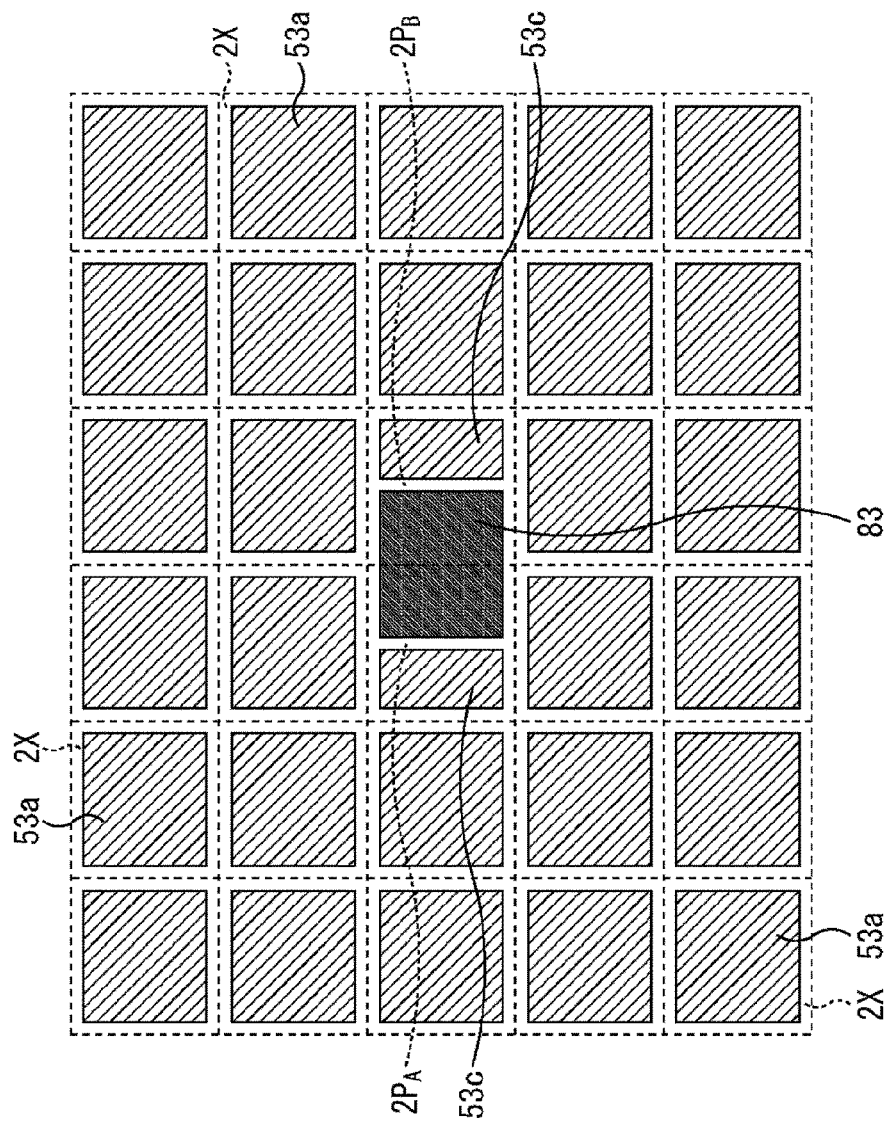
FIG. 13 is a view illustrating a variation of the third embodiment.

Also, although it is described that an element separating electrode 81 is extended on the assumption that the element separating electrode 81 is formed into a lattice shape on a pixel boundary in the vertical direction and in the horizontal direction in the description above, the element separating electrode 81 in the lattice shape may be omitted as illustrated in FIG. 13. Also, it is of course possible to configure such that the element separating electrode 81 in the lattice shape is omitted from the layout illustrated in FIG. 8 and only an element separating electrode 83 having an island shape is provided. In this case, predetermined fixed potential is applied only to the element separating electrode 83 having the island shape. Furthermore, a shape may be such that not an entire element separating electrode 81 in the lattice shape is omitted but only a part of the element separating electrode 81 in the lattice shape is omitted to form a H shape, for example.

Meanwhile, difference between the element separating electrode 83 in the island shape illustrated in FIG. 13 and a lower electrode 53c in an island shape of a dummy pixel $2D_{AB}$ of the second embodiment illustrated in FIG. 6 is that the former is connected to metal wiring 82 which supplies predetermined fixed potential and the latter is connected to a FD unit 49 which accumulates a charge. The element separating electrode 83 in the island shape illustrated in FIG. 13 may also have an isolated pattern without being connected to the metal wiring 82 formed below the same. Alternatively, it is also possible to configure such that the element separating electrode 83 in the island shape in FIG. 13 is not connected to the metal wiring 82 formed below the same but connected to the FD unit 49 to accumulate the charge to discharge.

5. Fourth Embodiment of Pixel

<Cross-Sectional Configuration of Pixel>

Next, a fourth embodiment is described.

In the above-described first to third embodiments, each pixel 2 receives light of all wavelengths of red (R), green (G), and blue (B) by a photoelectric converting unit 61 and photodiodes PD1 and PD2; however, fourth to sixth embodiments to be described hereinafter are different in that each pixel 2 receives only light of any of the wavelengths of red (R), green (G), and blue (B).

Figure 14:
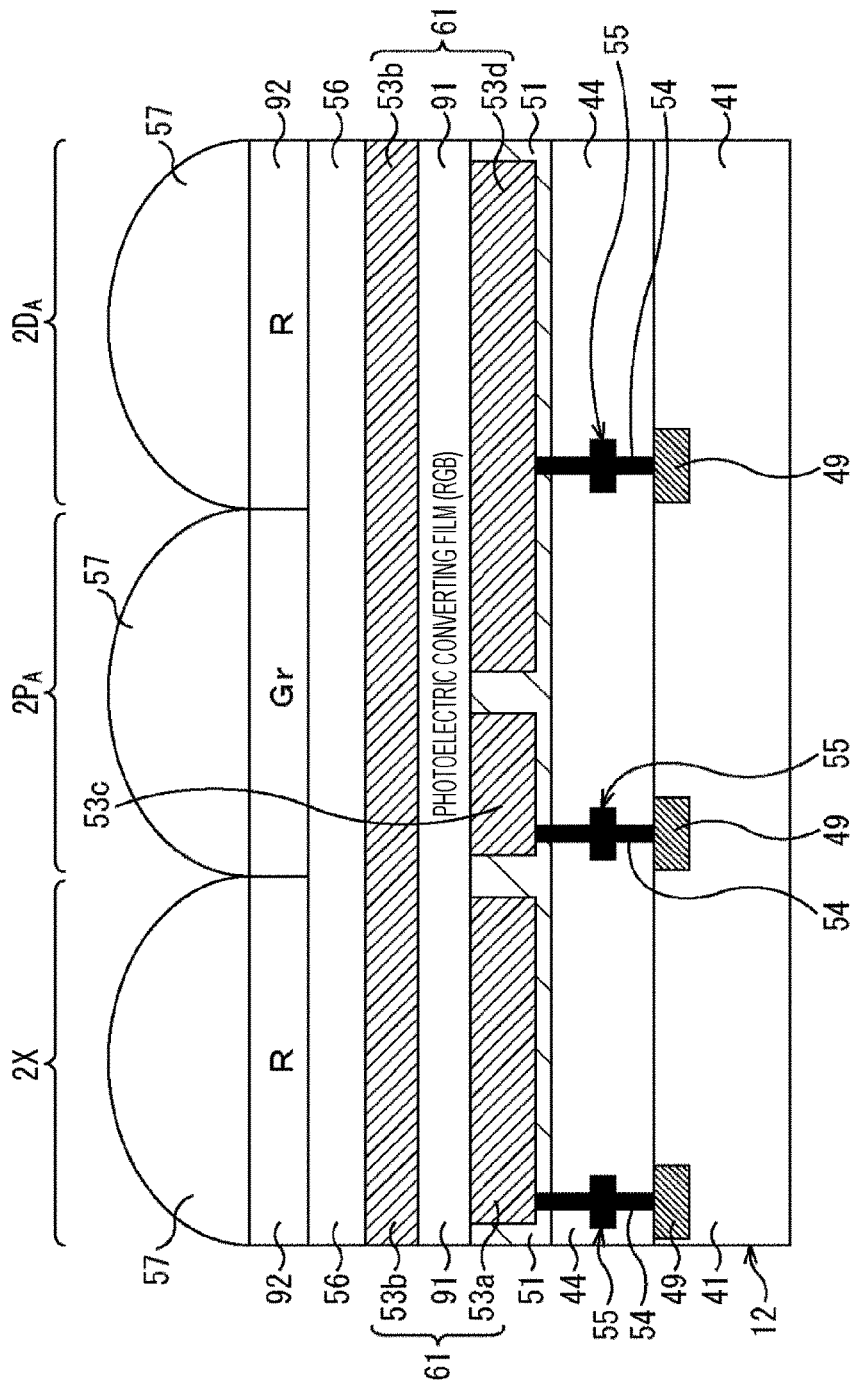
FIG. 14 is a cross-sectional configuration diagram of a pixel of a fourth embodiment.

FIG. 14 being a cross-sectional configuration diagram of the pixel 2 of the fourth embodiment illustrates a cross-sectional configuration of a portion corresponding to line Y1-Y1' in FIG. 3 in which one normal pixel 2X and a pair of a phase difference pixel $2P_A$ and a dummy pixel $2D_A$ are included.

Comparing the cross-sectional configuration of the first embodiment illustrated in FIG. 4 with the cross-sectional configuration of the fourth embodiment in FIG. 14 being the cross-sectional configuration diagrams taken along line Y1-Y1' in FIG. 3, in FIG. 14, a photoelectric converting film 52 which performs photoelectric conversion on green wavelength light in FIG. 4 is replaced with a photoelectric converting film 91 which performs the photoelectric conversion on the light of all the wavelengths of red (R), green (G), and blue (B). Also, the photodiode PD1 which receives the blue light and the photodiode PD2 which receives the red light are not provided in a semiconductor substrate 12.

Furthermore, in FIG. 14, a color filter 92 which transmits the light of the wavelength of red (R), green (G), or blue (B) is newly provided between a high refractive index layer 56 and an on-chip lens 57.

Therefore, only the light of any of the wavelengths of red (R), green (G), and blue (B) which passes the color filter 92 achieves the photoelectric converting film 91, so that each pixel 2 receives only the light of any of the wavelengths of red (R), green (G), and blue (B).

Also, a rear surface irradiation type configuration in which the photoelectric converting unit 61 and the on-chip lens 57 are formed on a rear surface side opposite to a surface side on which a multi-layer wiring layer 44 is formed is adopted in the first embodiment illustrated in FIG. 4. On the other hand, in the fourth embodiment in FIG. 14, a surface irradiation type configuration in which the photoelectric converting unit 61 and the on-chip lens 57 are formed on the surface side of the semiconductor substrate 12, the side on which the multi-layer wiring layer 44 is formed is adopted.

More specifically, the multi-layer wiring layer 44 is formed on the surface side of the semiconductor substrate 12 and a transparent insulating film 51, a lower electrode 53a, the photoelectric converting film 91, an upper electrode 53b, the high refractive index layer 56 and the like are formed on an upper surface of the multi-layer wiring layer 44.

Since the multi-layer wiring layer 44 is formed on the surface side of the semiconductor substrate 12, the FD unit 49 which holds the charge generated by a photoelectric converting film 52 is also formed on the surface side of the semiconductor substrate 12. Therefore, in the fourth embodiment, a conductive plug 46 and an insulating film 47 for extracting the charge generated by the photoelectric converting film 91 to the rear surface side of the semiconductor substrate 12 are not provided.

Figure 15:
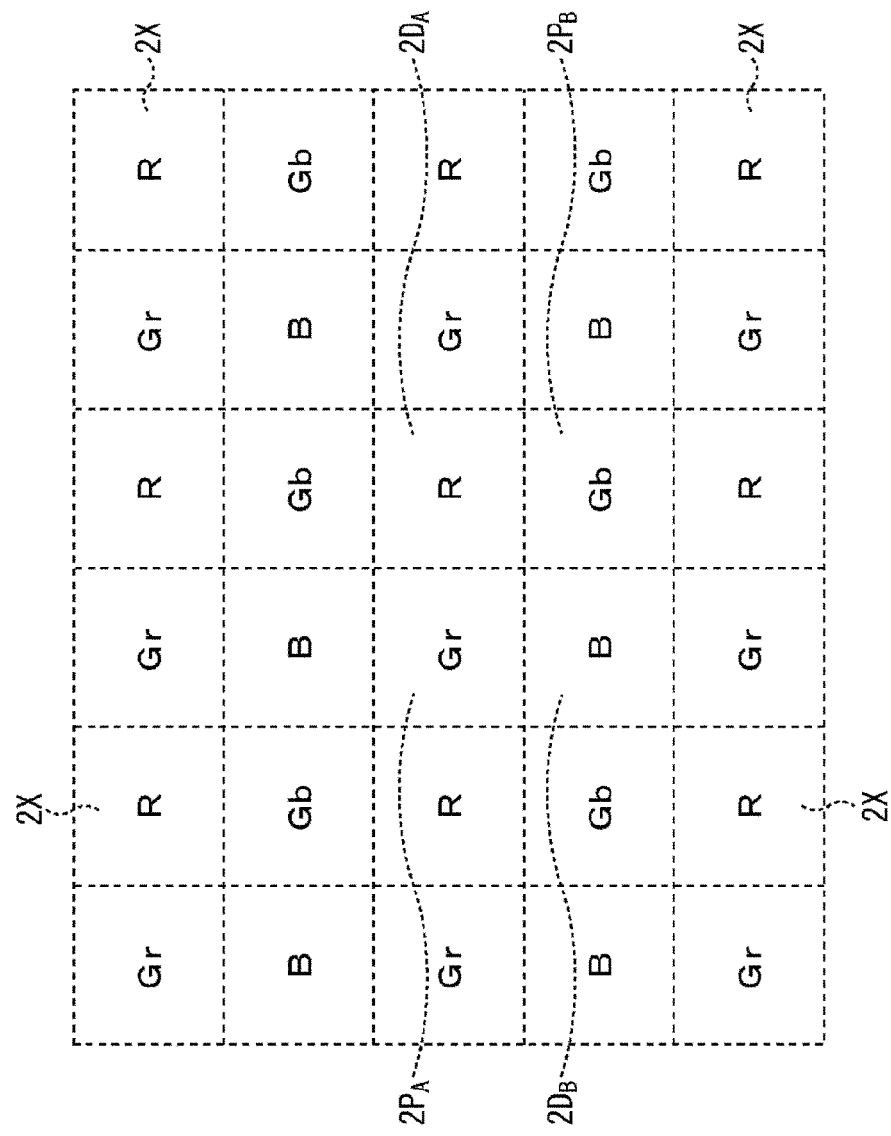
FIG. 15 is a view illustrating a layout example of color filters.

FIG. 15 is a view illustrating a layout example of the color filters 92 illustrated so as to correspond to the planar layout in FIG. 3.

The color filters 92 are arranged in Bayer arrangement, for example, as illustrated in FIG. 15.

Meanwhile, although the phase difference pixel $2P_A$ and a phase difference pixel $2P_B$ are the pixels which receive a green (Gr, Gb) wavelength, the dummy pixel $2D_A$ is the pixel which receives a red (R) wavelength, and a dummy pixel $2D_B$ is the pixel which receives a blue (B) wavelength in the example in FIG. 15, the wavelengths (colors) of the light received by the phase difference pixel 2P and the dummy pixel 2D are not limited to this example. However, it is desirable that the wavelength of the light received by the phase difference pixel $2P_A$ and the wavelength of the light received by the phase difference pixel $2P_B$ are the same. Also, it is possible to make the phase difference pixels $2P_A$ and $2P_B$ white pixels which receive the light of all the wavelengths by using a material which transmits all the wavelengths in place of the color filter 92. When the phase difference pixels $2P_A$ and $2P_B$ are made the white pixels, the material used in place of the color filter 92 may be the same material as that of the high refractive index layer 56 and the on-chip lens 57, for example.

6. Fifth Embodiment of Pixel

<Cross-Sectional Configuration of Pixel>
Next, a fifth embodiment is described.

Figure 16:
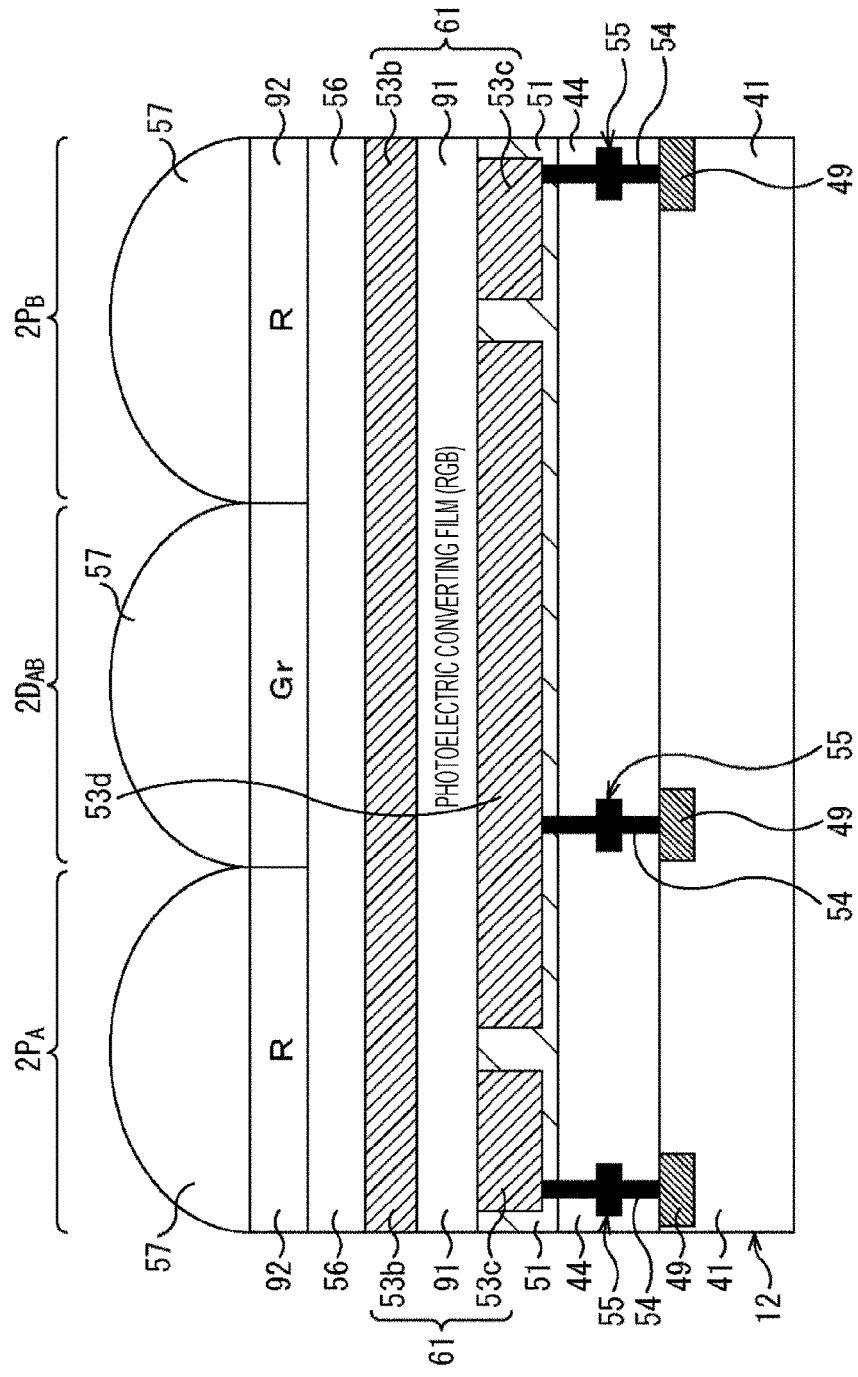
FIG. 16 is a cross-sectional configuration diagram of a pixel of a fifth embodiment.

FIG. 16 being a cross-sectional configuration diagram of a pixel 2 of the fifth embodiment illustrates a cross-sectional configuration of a portion corresponding to line Y11-Y11' in FIG. 6 in which phase difference pixels $2P_A$ and $2P_B$ and a dummy pixel $2D_{AB}$ interposed therebetween are included.

In the fifth embodiment, a wavelength of light received by each pixel 2 is configured so as to be similar to that of the fourth embodiment described with reference to FIG. 14 and an arrangement configuration of lower electrodes 53c and 53d is similar to that of the second embodiment described with reference to FIG. 7.

That is to say, in FIG. 16, color filters 92 in Bayer arrangement is formed between a high refractive index layer 56 and an on-chip lens 57 and a photoelectric converting film 91 which performs photoelectric conversion on light of all the wavelengths of red (R), green (G), and blue (B) is formed between the lower electrode 53c or 53d and an upper electrode 53b. According to this, a photoelectric converting unit 61 of each pixel 2 receives only the light of any of the wavelengths of red (R), green (G), and blue (B).

Also, the phase difference pixels $2P_A$ and $2P_B$ are arranged in a linear manner with the dummy pixel $2D_{AB}$ interposed therebetween. Then, the lower electrode 53d of the dummy pixel $2D_{AB}$ arranged in the center is extended to regions which are vacant due to downsizing of the lower electrodes 53c of the phase difference pixels $2P_A$ and $2P_B$ to be formed.

Also, a pixel structure of the fifth embodiment is a surface irradiation type structure in which the photoelectric converting unit 61 and the on-chip lens 57 are formed on a surface side of a semiconductor substrate 12, the side on which a multi-layer wiring layer 44 is formed.

7. Sixth Embodiment of Pixel

<Cross-Sectional Configuration of Pixel>
Next, a sixth embodiment is described.

Figure 17:
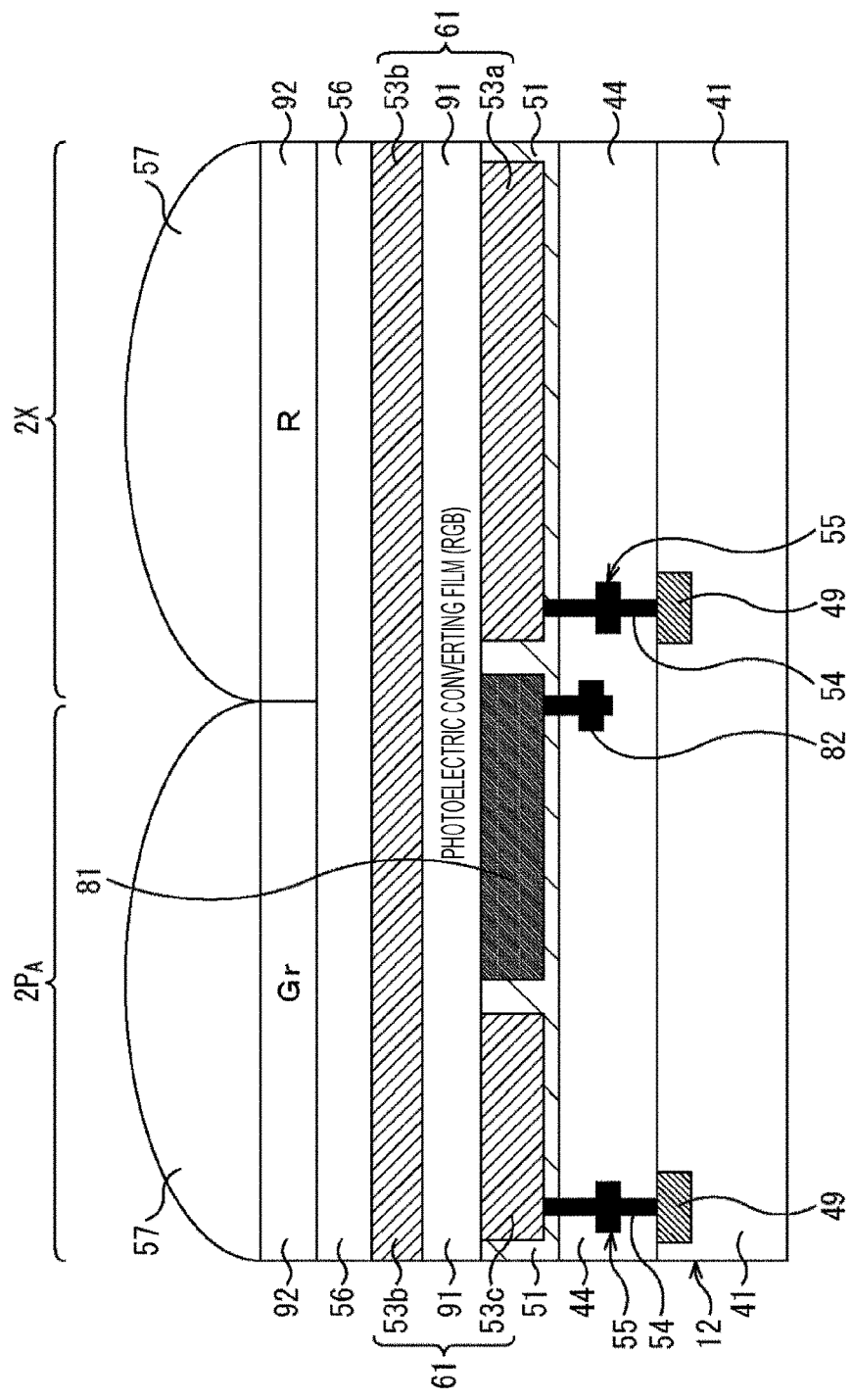
FIG. 17 is a cross-sectional configuration diagram of a pixel of a sixth embodiment.
Figure 18:
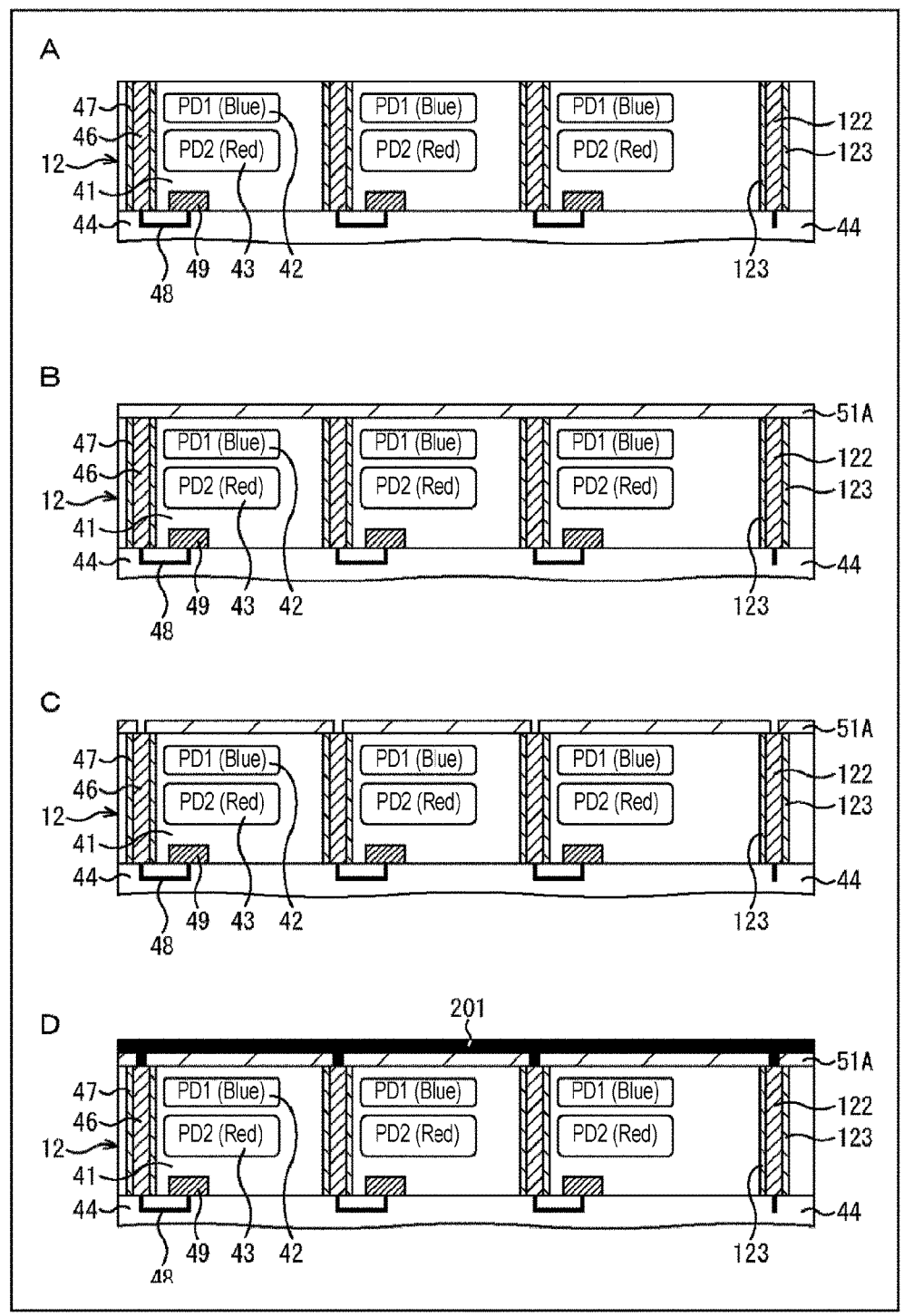
FIGS. 18A to 18D are a view illustrating a method of manufacturing of the first embodiment.
Figure 19:
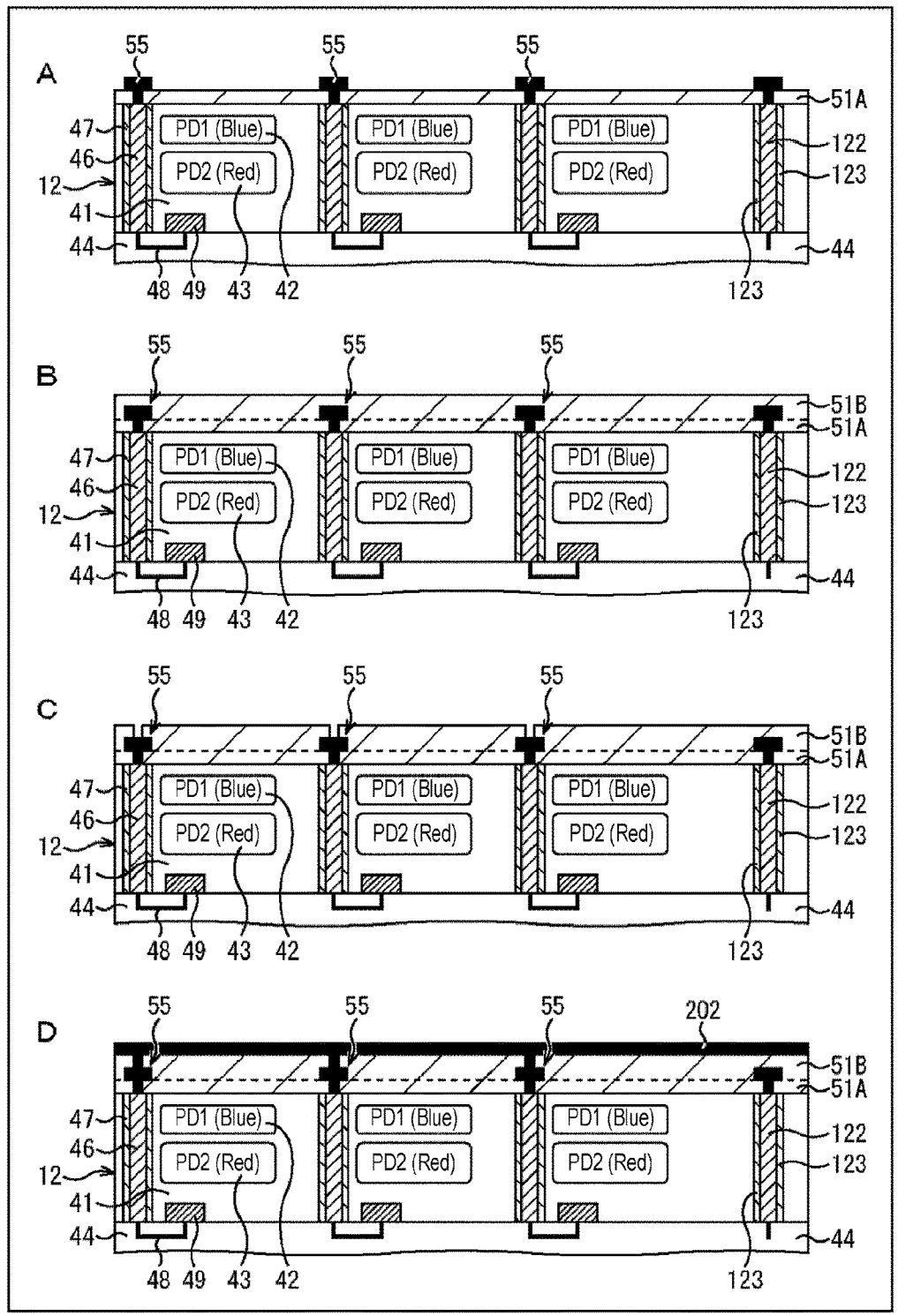
FIGS. 19A to 19D are a view illustrating the method of manufacturing of the first embodiment.
Figure 20:
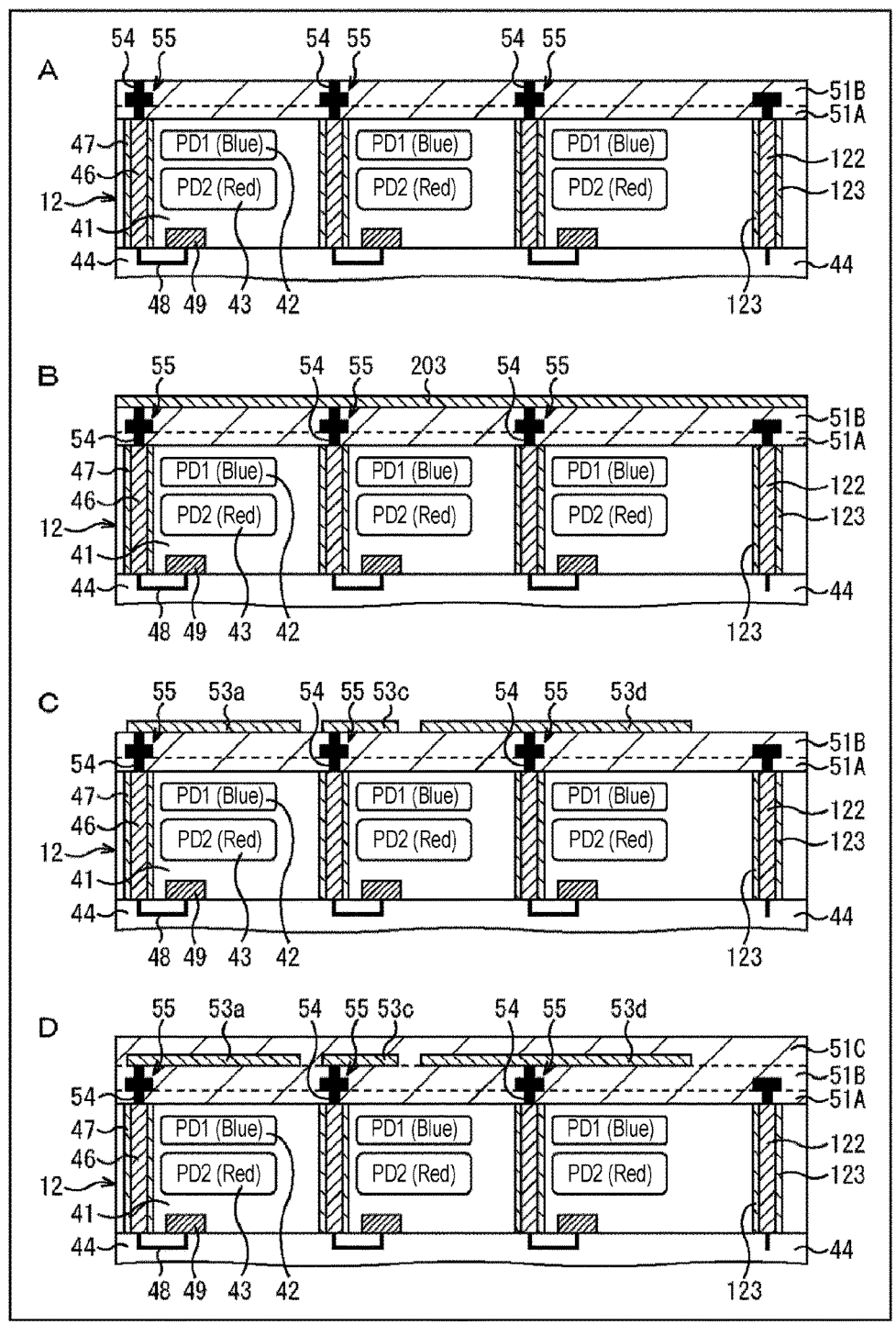
FIGS. 20A to 20D are a view illustrating the method of manufacturing of the first embodiment.
Figure 21:
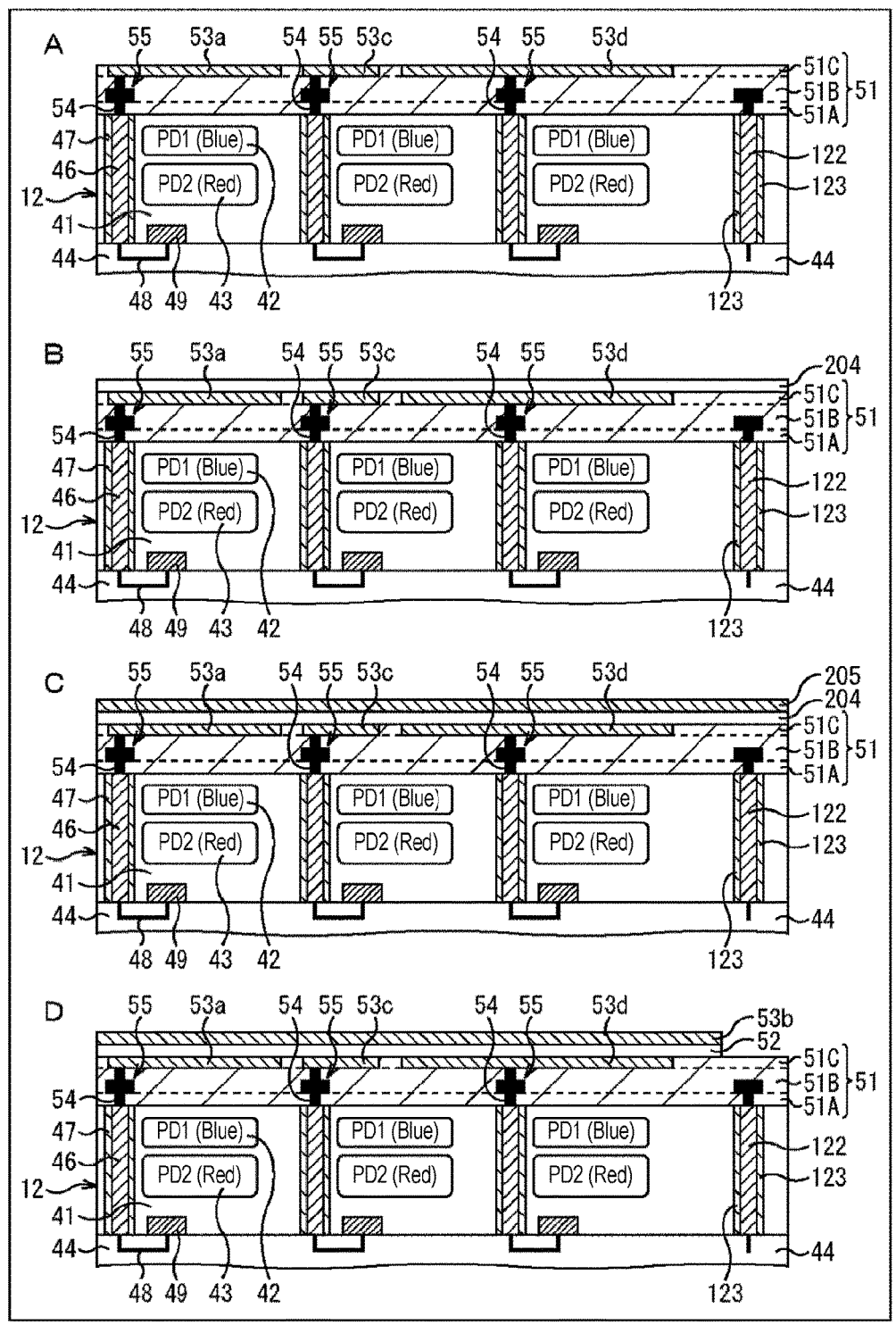
FIGS. 21A to 21D are a view illustrating the method of manufacturing of the first embodiment.
Figure 22:
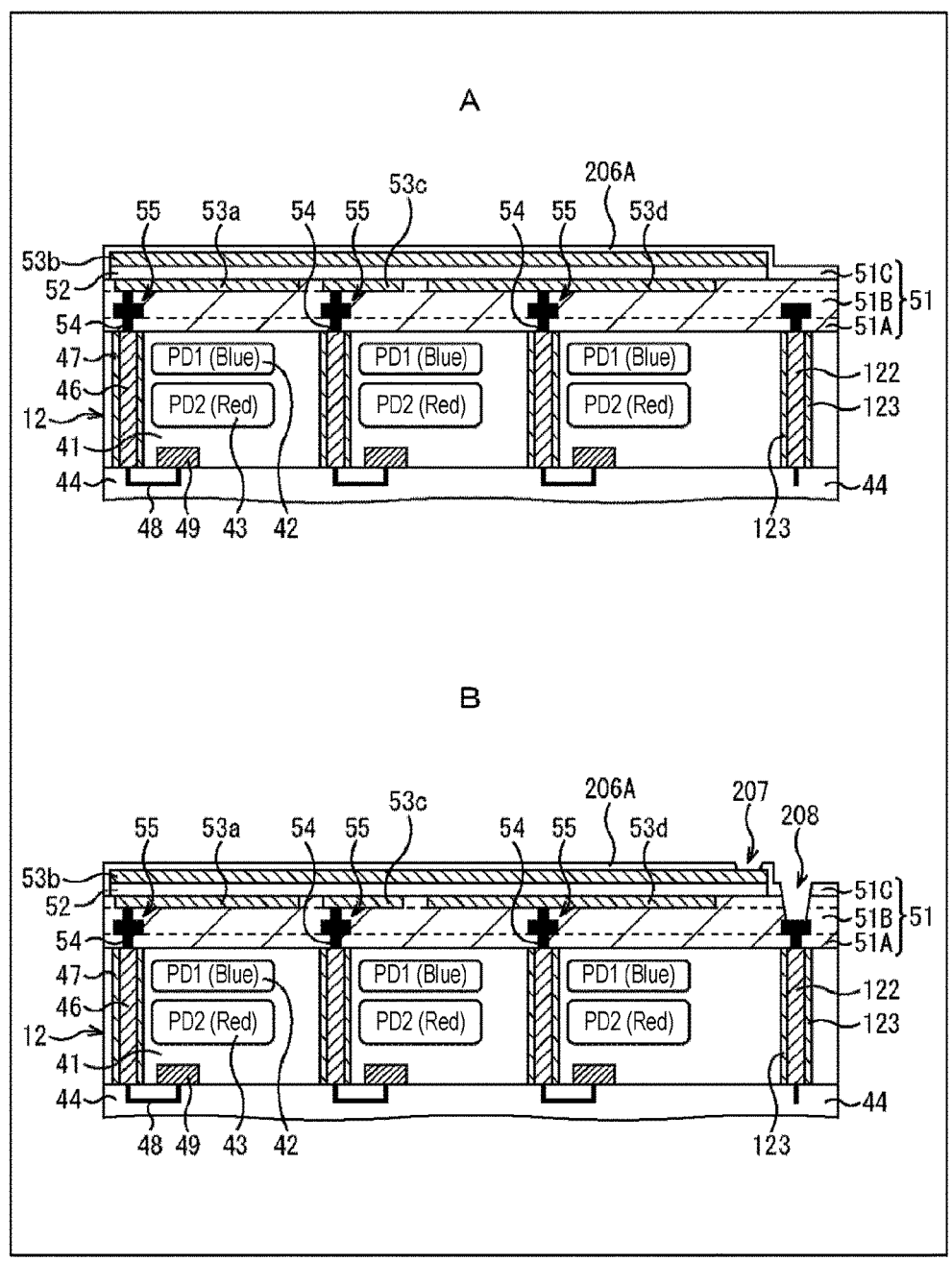
FIGS. 22A and 22B are a view illustrating the method of manufacturing of the first embodiment.
Figure 23:
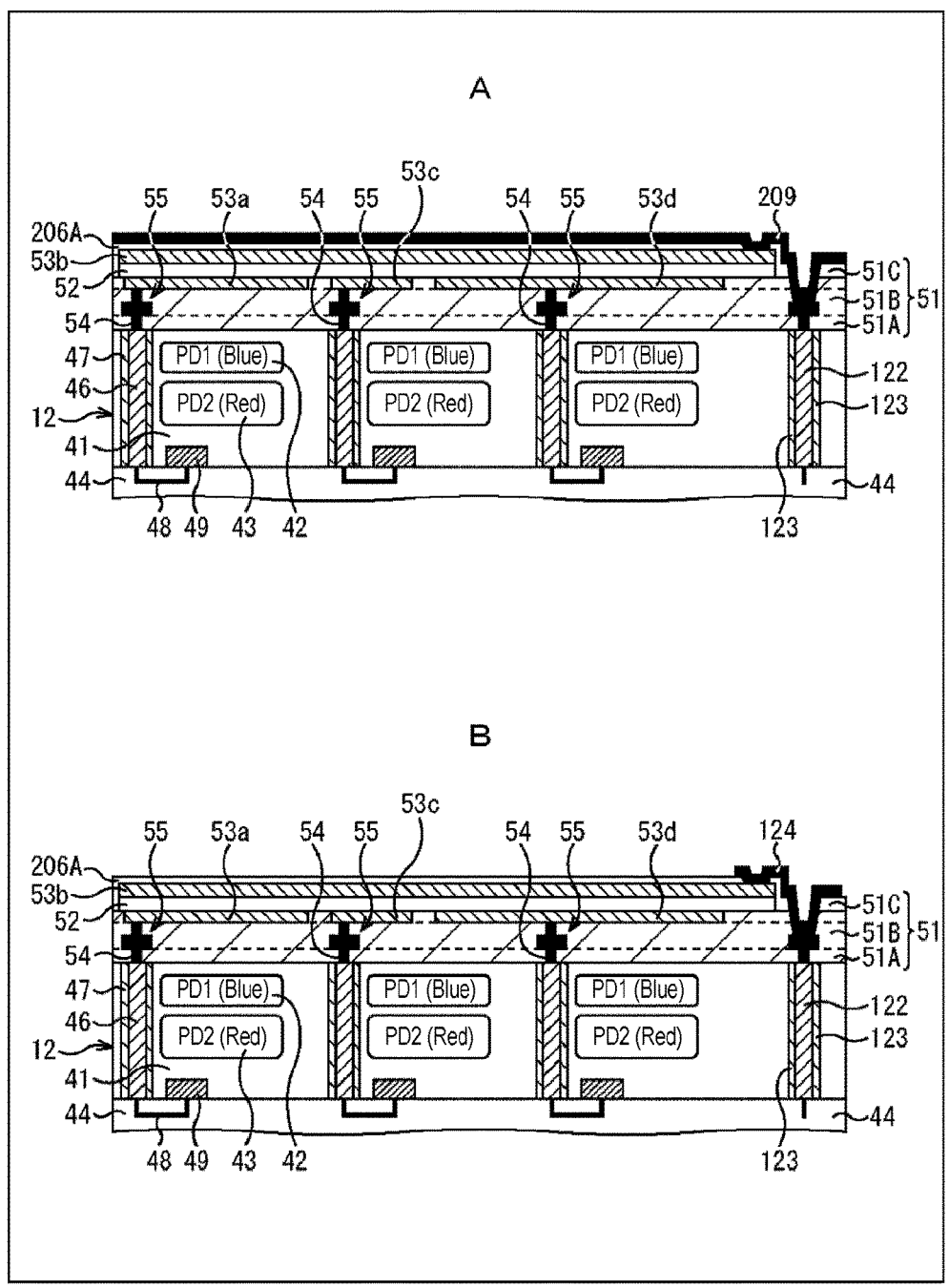
FIGS. 23A and 23B are a view illustrating the method of manufacturing of the first embodiment.
Figure 24:
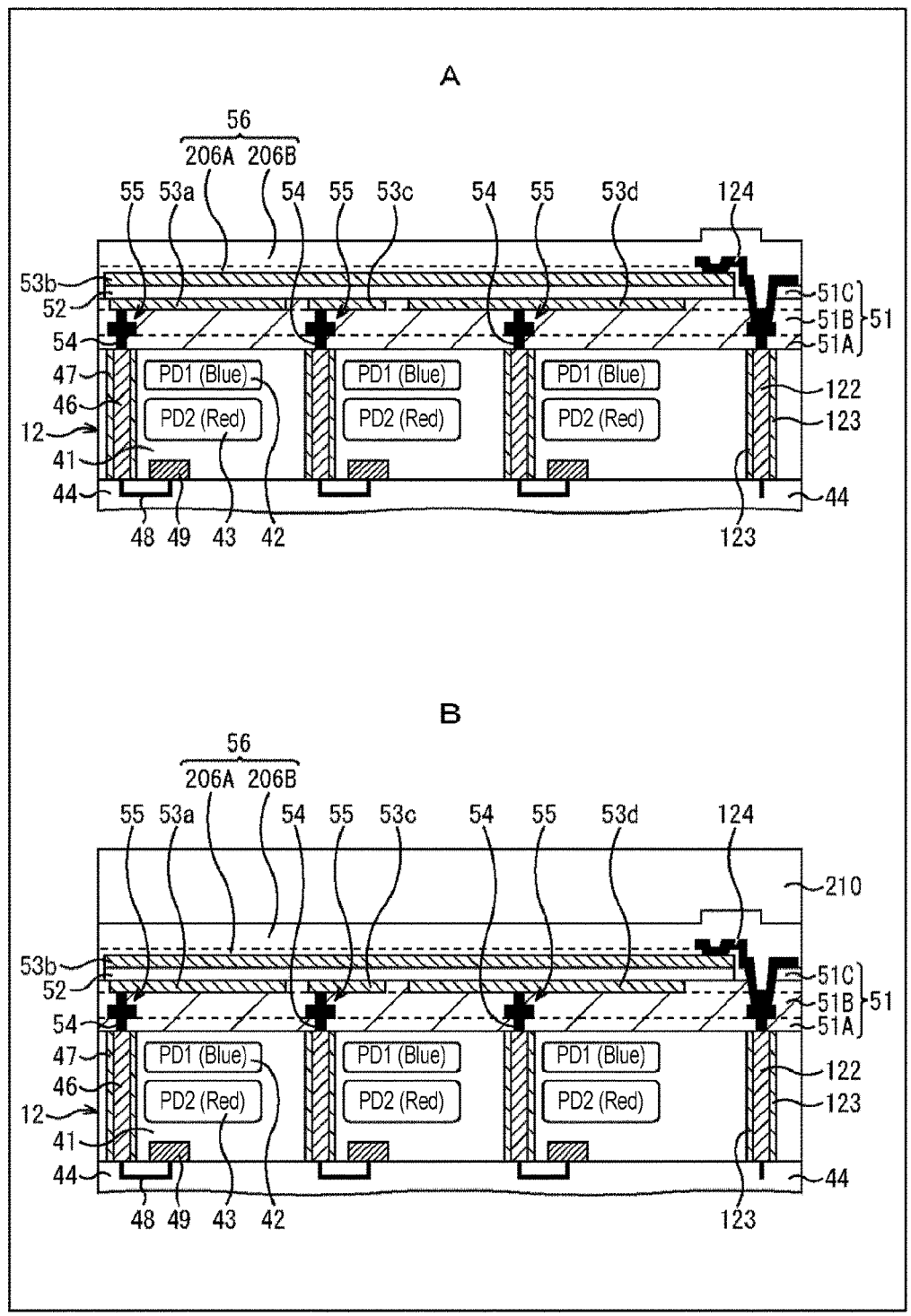
FIGS. 24A and 24B are a view illustrating the method of manufacturing of the first embodiment.
Figure 25:
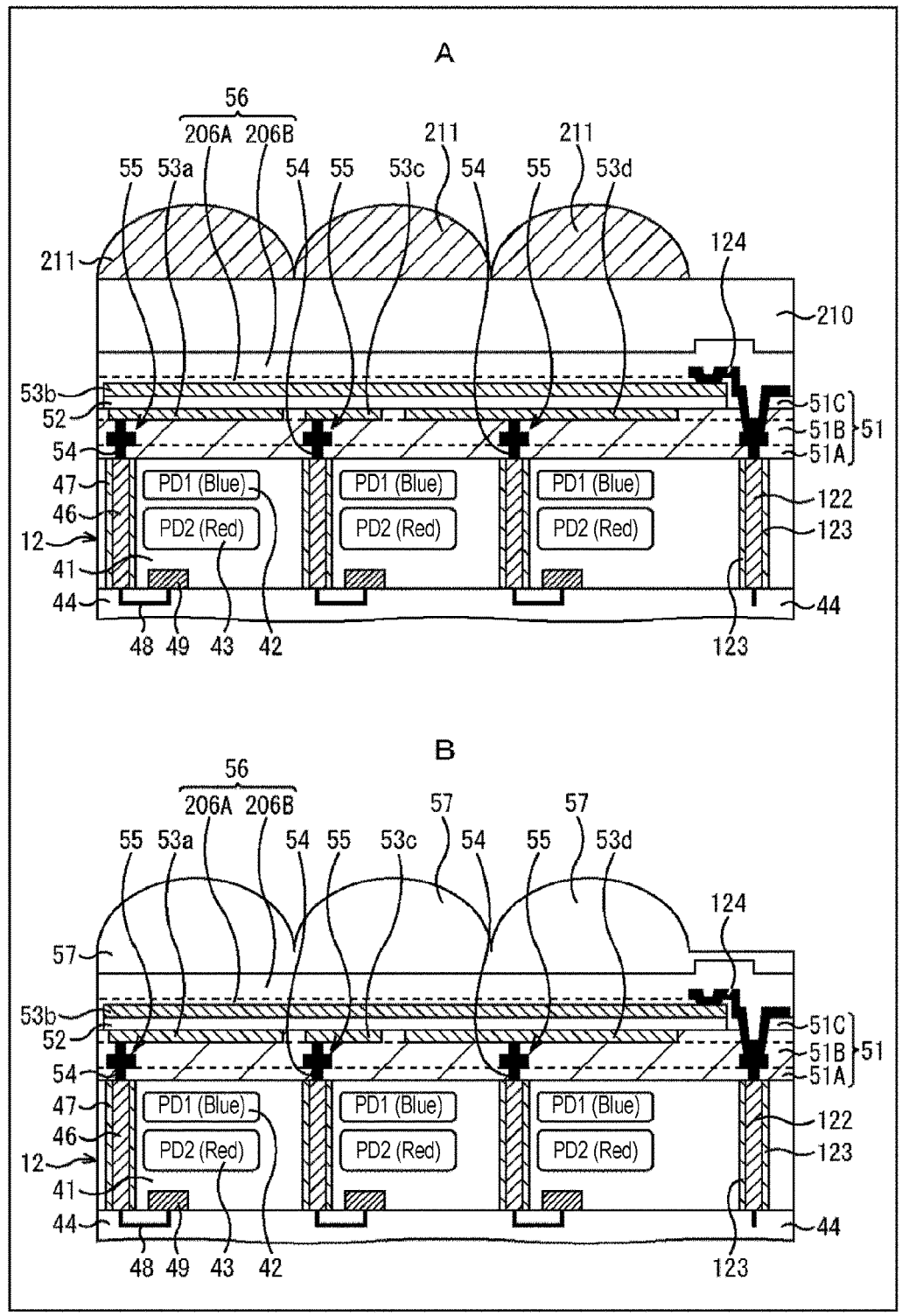
FIGS. 25A and 25B are a view illustrating the method of manufacturing of the first embodiment.

FIG. 17 being a cross-sectional configuration diagram of a pixel 2 of the sixth embodiment illustrates a cross-sectional configuration of a portion corresponding to line Y21-Y21' in FIG. 8 in which one normal pixel 2X and one phase difference pixel $2P_A$ are included.

In the sixth embodiment, a wavelength of light received by each pixel 2 is configured so as to be similar to that of the fourth embodiment described with reference to FIG. 14 and an arrangement configuration of a lower electrode 53c and an element separating electrode 81 is similar to that of the third embodiment described with reference to FIG. 10.

That is to say, in FIG. 17, color filters 92 in Bayer arrangement are formed between a high refractive index layer 56 and an on-chip lens 57 and a photoelectric converting film 91 which performs photoelectric conversion on light of all the wavelengths of red (R), green (G), and blue (B) is formed between a lower electrode 53a or 53c and an upper electrode 53b. According to this, a photoelectric converting unit 61 of each pixel 2 receives only the light of any of the wavelengths of red (R), green (G), and blue (B).

Also, the element separating electrode 81 is formed between the phase difference pixel $2P_A$ and the normal pixel 2X, and the element separating electrode 81 is formed in a region which is vacant due to downsizing of the lower electrode 53c of the phase difference pixel $2P_A$ so as to be extended from a pixel boundary line as illustrated in FIG. 17.

Although not illustrated, in a portion in which the normal pixels 2X of the sixth embodiment are adjacent to each other, as in FIG. 9, the element separating electrode 81 is formed in a position on the pixel boundary. Also, in a portion in which a phase difference pixel $2P_B$ and the normal pixel 2X are adjacent to each other, as in FIG. 11, the element separating electrode 81 is formed in a region which is vacant due to the downsizing of the lower electrode 53c of the phase difference pixel $2P_B$ so as to be extended from the pixel boundary line.

Also, a pixel structure of the sixth embodiment is a surface irradiation type structure in which the photoelectric converting unit 61 and the on-chip lens 57 are formed on a surface side of a semiconductor substrate 12, the side on which a multi-layer wiring layer 44 is formed.

In the above-described fourth to sixth embodiments also, positions in which the lower electrodes 53c are formed in the phase difference pixels $2P_A$ and $2P_B$ are symmetrical with each other. Displacement in image occurs between pixel signals from the phase difference pixels $2P_A$ and $2P_B$ because the lower electrodes 53c are formed in different positions. It is possible to realize automatic focusing by calculating a defocusing amount by calculating a phase displacement amount from the displacement in image to adjust (move) an imaging lens.

It is not required to form a light shielding film on an upper surface of the photoelectric converting film 91 also in the fourth to sixth embodiments, so that it is possible to realize the phase difference pixel while avoiding an increase in the number of steps. Also, it is not required to separate the photoelectric converting film 91 between the pixels, so that it is possible to inhibit dark current generated when the photoelectric converting film 91 is separated between the pixels.

Therefore, it is possible to form a more preferable phase difference pixel 2P for detecting a focal point by using the photoelectric converting film 91 formed on an outer side of the semiconductor substrate 12 also in the fourth to sixth embodiments.

Meanwhile, although the structure illustrated as the fourth to sixth embodiments is the surface irradiation type pixel structure, this may also be a rear surface irradiation type pixel structure as that of the first to third embodiments.

It is possible to change the phase difference pixels $2P_A$ and $2P_B$ to white pixels also in the fifth and sixth embodiments.

Also, a lower electrode 53d of a dummy pixel 2D of the first to third embodiments and the element separating electrode 81 of the fourth to sixth embodiments are the electrodes extending at least to the boundary of the pixel.

8. Manufacturing Method of First Embodiment

Next, a method of manufacturing a pixel 2 according to the first embodiment illustrated in FIG. 4 is described with reference to FIGS. 18A to 25B.

Meanwhile, in FIGS. 18A to 25B, a method of manufacturing a power supply unit to an upper electrode 53b not illustrated in FIG. 4 is also illustrated.

First, as illustrated in FIG. 18A, photodiodes PD1 and PD2, a conductive plug 46, a FD unit 49, a conductive plug 122 for supplying power to the upper electrode 53b and the like are formed in a semiconductor region 41 of a semiconductor substrate 12. An outer periphery of the conductive plug 122 is covered with a SiO2 or SiN insulating film 123.

Also, a plurality of pixel transistors which reads charges accumulated in the photodiodes PD1 and PD2 and a multi-layer wiring layer 44 formed of a plurality of wiring layers and an interlayer insulating film are formed on a surface side (lower side in the drawing) of the semiconductor substrate 12.

Then, as illustrated in FIG. 18B, a transparent insulating film 51A is formed to have a predetermined film thickness on an interface on a rear surface side of the semiconductor substrate 12.

Next, as illustrated in FIG. 18C, only a region connected to the conductive plug 46 out of the transparent insulating film 51A formed on the interface on the rear surface side of the semiconductor substrate 12 is opened by lithography.

Then, as illustrated in FIG. 18D, a metal material 201 such as tungsten (W), aluminum (Al), and copper (Cu) is formed on an entire surface of an upper side of the transparent insulating film 51A including an opened dug portion of the transparent insulating film 51A.

The metal material 201 formed on the entire surface of the transparent insulating film 51A is patterned with only a desired region left by lithography as illustrated in FIG. 19A, and according to this, an interpixel light shielding film 55 is formed.

Furthermore, a transparent insulating film 51B is stacked above the transparent insulating film 51A and the interpixel light shielding film 55 as illustrated in FIG. 19B, and thereafter only a region connected to the conductive plug 46 out of the stacked transparent insulating film 51B is opened again by lithography as illustrated in FIG. 19C.

Then, a metal material 202 is formed on an entire surface on an upper side of the transparent insulating film 51B including an opened dug portion of the transparent insulating film 51B as illustrated in FIG. 19D, and thereafter, the metal material 202 on a surface layer is removed by chemical mechanical polishing (CMP), so that metal wiring 54 penetrating the transparent insulating films 51A and 51B is formed as illustrated in FIG. 20A.

Then, an indium tin oxide (ITO) film 203, for example, is deposited on the transparent insulating film 51B as illustrated in FIG. 20B and is patterned with only a desired region left by lithography, and according to this, a lower electrode 53a of a normal pixel 2X, a lower electrode 53c of a phase difference pixel $2P_A$, and a lower electrode 53d of a dummy pixel $2D_A$ are formed as illustrated in FIG. 20C.

Furthermore, after the transparent insulating film 51C is formed to have a predetermined film thickness on the transparent insulating film 51B including the lower electrodes 53a, 53c, and 53d as illustrated in FIG. 20D, the transparent insulating film 51C is removed by chemical mechanical polishing (CMP), for example, until this has the same film thickness as that of the lower electrode 53a and the like. As a result, as illustrated in FIG. 21A, the transparent insulating film 51 in FIG. 4 is completed by the remained transparent insulating film 51C and the transparent insulating films 51B and 51A below the same.

Subsequently, a photoelectric converting material 204 which performs photoelectric conversion on green wavelength light is formed on upper surfaces of the lower electrodes 53a, 53c, and 53d and the transparent insulating film 51 as illustrated in FIG. 21B, and thereafter, an indium tin oxide (ITO) film 205 is formed thereafter, for example, as illustrated in FIG. 21C.

Then, a photoelectric converting film 52 and the upper electrode 53b shared by the normal pixel 2X, the phase difference pixel 2P, and the dummy pixel 2D are completed as illustrated in FIG. 21D by etching with only a desired region left.

Subsequently, as illustrated in FIG. 22A, a highly refractive material 206A of a nitride film and the like serving as a high refractive index layer 56 is formed on upper surfaces of the upper electrode 53b in a pixel region and the transparent insulating film 51 on an outer peripheral portion of the pixel array unit 3.

Thereafter, a contact opening 207 is formed in a place serving as a contact portion of the upper electrode 53b and a contact opening 208 is formed in a place serving as a contact portion with the conductive plug 122 as illustrated in FIG. 22B.

Then, a metal material 209 such as tungsten (W) is conformally deposited on an upper surface of the highly refractive material 206A after the contact openings 207 and 208 are formed as illustrated in FIG. 23A, and thereafter, this is patterned such that only the outer peripheral portion of the pixel array unit 3 is left as illustrated in FIG. 23B, and according to this, connection wiring 124 which connects the conductive plug 122 to the upper electrode 53b is completed.

Then, as illustrated in FIG. 24A, a highly refractive material 206B of the same material as that of the highly refractive material 206A is further formed on the highly refractive material 206A and the connection wiring 124. The stacked highly refractive materials 206A and 206B serve as the high refractive index layer 56.

Next, after a resin material 210 being a material of the on-chip lens 57 is further formed on an upper surface of the high refractive index layer 56 as illustrated in FIG. 24B, a photo resist 211 is formed into a lens shape as illustrated in FIG. 25A. Then, the on-chip lens 57 is formed on an uppermost portion of each pixel 2 as illustrated in FIG. 25B by etching back on the basis of the lens-shaped photo resist 211.

The pixel 2 of the first embodiment illustrated in FIG. 4 may be manufactured in the above-described manner. Meanwhile, the photoelectric converting unit 61 of the pixel 2 may be similarly manufactured also in the second to sixth embodiments.

<Application Example to Electronic Device>

Application of the technology of the present disclosure is not limited to that to a solid-state image sensor. That is to say, the technology of the present disclosure is applicable to general electronic devices using the solid-state image sensor as an image capturing unit (photoelectric converting unit) such as an imaging device such as a digital still camera and a video camera, a portable terminal device having an imaging function, and a copying machine using the solid-state image sensor in an image reading unit. The solid-state image sensor may be in a form of a single chip, or may be in a form of a module having the imaging function obtained by packaging an imaging unit, a signal processor, or an optical system.

Figure 26:
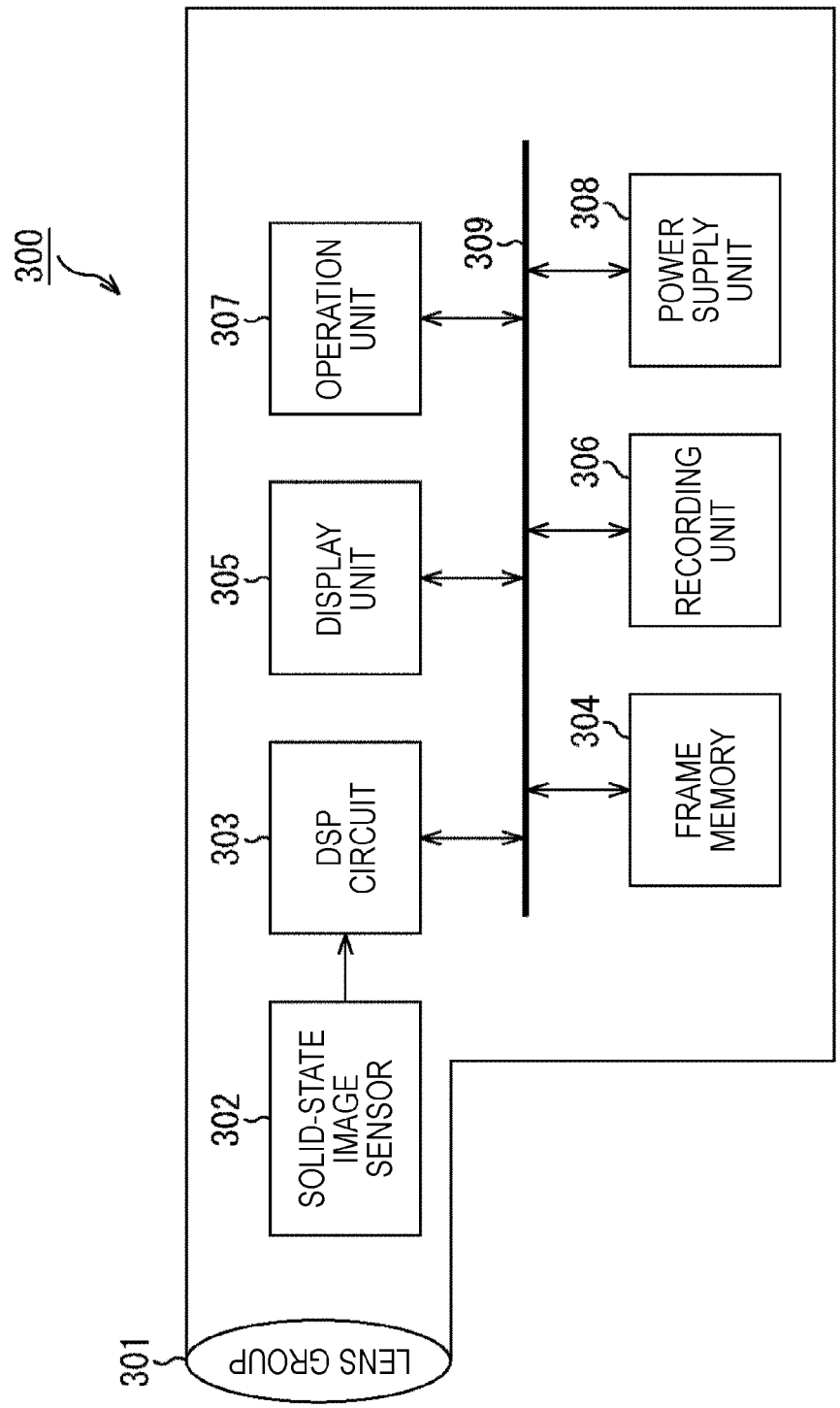
FIG. 26 is a block diagram illustrating a configuration example of an imaging device as an electronic device according to the present disclosure.

FIG. 26 is a block diagram illustrating a configuration example of the imaging device as the electronic device according to the present disclosure.

An imaging device 300 in FIG. 26 is provided with an optical unit 301 formed of a lens group and the like, a solid-state image sensor (imaging device) 302 to which a configuration of the solid-state image sensor 1 in FIG. 1 is adopted, and a digital signal processor (DSP) circuit 303 which is a camera signal processing circuit. The imaging device 300 is also provided with a frame memory 304, a display unit 305, a recording unit 306, an operation unit 307, and a power supply unit 308. The DSP circuit 303, the frame memory 304, the display unit 305, the recording unit 306, the operation unit 307, and the power supply unit 308 are connected to one another through a bus line 309.

The optical unit 301 captures incident light (image light) from an object and forms an image on an imaging surface of the solid-state image sensor 302. The solid-state image sensor 302 converts an amount of the incident light the image of which is formed on the imaging surface by the optical unit 301 to an electric signal in pixel unit and outputs the same as a pixel signal. The solid-state image sensor 1 in FIG. 1, that is to say, the solid-state image sensor which includes a pixel structure of the above-described normal pixel 2X, phase difference pixel 2P and the like may be used as the solid-state image sensor 302.

The display unit 305 formed of a panel display device such as a liquid crystal panel and an organic electro luminescence (EL) panel, for example, displays a moving image or a still image imaged by the solid-state image sensor 302. The recording unit 306 records the moving image or the still image imaged by the solid-state image sensor 302 in a recording medium such as a hard disk and a semiconductor memory.

The operation unit 307 issues an operation command regarding various functions of the imaging device 300 under operation by a user. The power supply unit 308 appropriately supplies various power sources serving as operation power sources of the DSP circuit 303, the frame memory 304, the display unit 305, the recording unit 306, and the operation unit 307 to supply targets.

As described above, it is possible to realize the phase difference pixel while avoiding an increase in the number of steps by adopting the solid-state image sensor 1 including the pixel 2 according to the above-described embodiments as the solid-state image sensor 302. Therefore, it is possible to improve a quality of the imaged image also in the imaging device 300 such as the video camera, the digital still camera, and further a camera module for a mobile device such as a cellular phone.

The embodiment of the present disclosure is not limited to the above-described embodiments and may be variously changed without departing from the gist of the present disclosure.

In the above-described first to third embodiments, the longitudinal direction spectral solid-state image sensor including one photoelectric converting layer (photoelectric converting film 52) above a semiconductor substrate 12 and including two inorganic photoelectric converting layers (photodiodes PD1 and PD2) in the semiconductor substrate 12 is described.

However, the technology of the present disclosure is similarly applicable to the longitudinal direction spectral solid-state image sensor including two photoelectric converting layers above the semiconductor substrate 12 and including one inorganic photoelectric converting layer in the semiconductor substrate 12.

Also, although it is described that the organic photoelectric converting material is used as the photoelectric converting film 52 of the photoelectric converting unit 61 formed above the semiconductor substrate 12 in the above-described embodiments, it is also possible to adopt an inorganic photoelectric converting material. The inorganic photoelectric converting material includes crystalline silicon, amorphous silicon, and a compound semiconductor such as a Cu—In—Ga—Se compound (CIGS), a Cu—In—Se compound (CIS), a chalcopyrite structure semiconductor, and GaAs, for example.

Although the planar size of the lower electrode 53c of the phase difference pixel 2P is half the size of the lower electrode 53a of the normal pixel 2X in the above-described embodiments, there is no limitation. It is sufficient that the sensitivities of the photoelectric converting units 61 of the phase difference pixels 2P are asymmetrical with respect to the light incident angle and the photoelectric conversion regions of the phase difference pixels $2P_A$ and $2P_B$ are symmetrical to each other.

Furthermore, although the upper electrode 53b forming the photoelectric converting unit 61 is formed on the entire surface so as to be shared by all the pixels and the lower electrode 53a is formed for each pixel in the above-described embodiments, it is also possible to form the upper electrode 53b for each pixel and form the lower electrode 53a on the entire surface so as to be shared by all the pixels. It is also possible to form both the lower electrode 53a and the upper electrode 53b for each pixel.

Although the solid-state image sensor in which the first conductivity type is the P-type and the second conductivity type is the N-type, and an electron is used as a signal charge is described in the above-described example, the present disclosure is also applicable to the solid-state image sensor in which a positive hole is used as the signal charge. That is, the first conductivity type may be the N-type, the second conductivity type may be the P-type, and the conductivity types of the above-described respective semiconductor regions may be reversed.

Also, the technology of the present disclosure is applicable not only to the solid-state image sensor which senses incident light amount distribution of visible light and images as an image but also to the general solid-state image sensor (physical amount distribution sensing device) such as the solid-state image sensor which images incident amount distribution of infrared rays, X-rays, or particles as an image, or a fingerprint detecting sensor which senses distribution of other physical amounts such as a pressure and capacitance and images as an image in a broad sense.

The embodiment of the present disclosure is not limited to the above-described embodiments and may be variously changed without departing from the gist of the present disclosure.

For example, it is possible to adopt a combination of all or some of a plurality of embodiments described above.

Meanwhile, the effects described in this specification are illustrative only and are not limited; the effects other than those described in this specification may also be included.

Meanwhile, the present disclosure may also have the following configuration.

(1)

A solid-state image sensor including:

a first pixel including a photoelectric converting unit formed of a photoelectric converting film and first and second electrodes which interpose the photoelectric converting film from above and below in which at least one of the first and second electrodes is a separated electrode separated for each pixel; and a second pixel including the photoelectric converting unit in which the separated electrode is formed to have a planar size smaller than the planar size of the separated electrode of the first pixel and a third electrode extending at least to a boundary of the pixel is formed in a region which is vacant due to a smaller planar size.

(2)

The solid-state image sensor according to (1) described above, wherein the third electrode is connected to a charge holding unit which holds a charge generated by the photoelectric converting unit.

(3)
The solid-state image sensor according to (1) or (2) described above, wherein
the third electrode is the separated electrode of an adjacent pixel.

(4)
The solid-state image sensor according to (1) or (2) described above, wherein
the third electrode lies across three pixels including the second pixel and an adjacent pixel.

(5)
The solid-state image sensor according to (1) described above, wherein
the third electrode is connected to wiring which supplies fixed potential.

(6)
The solid-state image sensor according to (1) or (5) described above, wherein
the third electrode is an element separating electrode formed between separated electrodes of adjacent pixels.

(7)
The solid-state image sensor according to (1) described above, wherein
the third electrode is an isolated pattern which is not connected to wiring.

(8)
The solid-state image sensor according to any one of (1) to (7) described above, wherein
the second pixel is a phase difference pixel which generates a signal for detecting a focal point.

(9)
The solid-state image sensor according to any one of (1) to (8) described above, wherein
the photoelectric converting film is a film which performs photoelectric conversion on light of a wavelength of a predetermined color.

(10)
The solid-state image sensor according to (9) described above, wherein
the photoelectric converting film is a film which performs the photoelectric conversion on green wavelength light.

(11)
The solid-state image sensor according to any one of (1) to (10) described above, wherein
the second pixel is further provided with an inorganic photoelectric converting unit in a semiconductor substrate, and
the inorganic photoelectric converting unit performs the photoelectric conversion on light of a wavelength which is not subjected to the photoelectric conversion by the photoelectric converting unit.

(12)
The solid-state image sensor according to any one of (1) to (7) described above, wherein
the photoelectric converting film is a film capable of performing photoelectric conversion on light of wavelengths of red, green, and blue.

(13)
The solid-state image sensor according to (12) described above, wherein
a red, green, or blue color filter is arranged above the photoelectric converting film, and
the photoelectric converting film performs the photoelectric conversion on light which passes through the color filter.

(14)
A method of manufacturing a solid-state image sensor including:
forming a first pixel including a photoelectric converting unit formed of a photoelectric converting film and first and second electrodes which interpose the photoelectric converting film from above and below in which at least one of the first and second electrodes is a separated electrode separated for each pixel, and
a second pixel including the photoelectric converting unit in which the separated electrode is formed to have a planar size smaller than the planar size of the separated electrode of the first pixel and a third electrode extending at least to a boundary of the pixel is formed in a region which is vacant due to a smaller planar size.

(15)
An electronic device including:
a solid-state image sensor including:
a first pixel including a photoelectric converting unit formed of a photoelectric converting film and first and second electrodes which interpose the photoelectric converting film from above and below in which at least one of the first and second electrodes is a separated electrode separated for each pixel; and
a second pixel including the photoelectric converting unit in which the separated electrode is formed to have a planar size smaller than the planar size of the separated electrode of the first pixel and a third electrode extending at least to a boundary of the pixel is formed in a region which is vacant due to a smaller planar size.

REFERENCE SIGNS LIST

1 Solid-state image sensor
2 Pixel
2X Normal pixel
2P Phase difference pixel
2D Dummy pixel
3 Pixel array unit
12 Semiconductor substrate
PD1, PD2 Photodiode
41 to 43 Semiconductor region
49 FD unit
52 Photoelectric converting film
53a Lower electrode
53b Upper electrode
53c, 53d Lower electrode
54 Metal wiring
56 High refractive index layer
57 On-chip lens
61 Photoelectric converting unit
81 Element separating electrode
82 Metal wiring
83 Element separating electrode
91 Photoelectric converting film
92 Color filter
300 Imaging device
302 Solid-state image sensor

What is claimed is:
1. A solid-state image sensor comprising:
a first pixel including a photoelectric converting unit formed of a photoelectric converting film, a first electrode above the photoelectric converting film, and a separated electrode below the photoelectric converting film, the separated electrode including a second electrode below the photoelectric converting film; and a second pixel including the photoelectric converting unit, the separated electrode including a third electrode and a fourth electrode, the third electrode formed to have a planar size smaller than a planar size of the second electrode, wherein the fourth electrode extends at least to a boundary of the second pixel and is formed in a region which is vacant due to the smaller planar size of the third electrode, and wherein the second pixel is a phase difference pixel which generates a signal for detecting a focal point, and wherein the fourth electrode is connected to a semiconductor region disposed in a semiconductor substrate.

2. The solid-state image sensor according to claim 1, wherein
the semiconductor region is a charge holding unit which holds a charge generated by the photoelectric converting unit.

3. The solid-state image sensor according to claim 1, wherein
the fourth electrode is an electrode of a third pixel that is adjacent to the second pixel.

4. The solid-state image sensor according to claim 1, wherein
the fourth electrode lies across three pixels including the second pixel and a third pixel adjacent to the second pixel.

5. The solid-state image sensor according to claim 1, wherein
the fourth electrode is an element separating electrode formed between separated electrodes of adjacent pixels.

6. The solid-state image sensor according to claim 1, wherein
the photoelectric converting film is a film which performs photoelectric conversion on light of a wavelength of a predetermined color.

7. The solid-state image sensor according to claim 6, wherein
the photoelectric converting film is a film which performs the photoelectric conversion on green wavelength light.

8. A solid-state image sensor, comprising:
a first pixel including a photoelectric converting unit formed of a photoelectric converting film, a first electrode above the photoelectric converting film, and a separated electrode below the photoelectric converting film, the separated electrode including a second electrode below the photoelectric converting film; and a second pixel including the photoelectric converting unit, and the separated electrode including a third electrode and a fourth electrode, the third electrode formed to have a planar size smaller than a planar size of the second electrode, wherein the fourth electrode extends at least to a boundary of the second pixel and is formed in a region which is vacant due to the smaller planar size of the third electrode, wherein,
the second pixel is further provided with an inorganic photoelectric converting unit in a semiconductor substrate, the inorganic photoelectric converting unit performs photoelectric conversion on light of a wavelength which is not subjected to the photoelectric conversion by the photoelectric converting unit, and the fourth electrode is connected to a semiconductor region disposed in a semiconductor substrate.

9. The solid-state image sensor according to claim 1, wherein
the photoelectric converting film is a film capable of performing photoelectric conversion on light of wavelengths of red, green, and blue.

10. The solid-state image sensor according to claim 9, wherein
a red, green, or blue color filter is arranged above the photoelectric converting film, and the photoelectric converting film performs the photoelectric conversion on light which passes through the red, green, or blue color filter.

11. A method of manufacturing a solid-state image sensor comprising:
forming a first pixel including a photoelectric converting unit formed of a photoelectric converting film, a first electrode above the photoelectric converting film, and a separated electrode below the photoelectric converting film, the separated electrode including a second electrode below the photoelectric converting film; and forming a second pixel including the photoelectric converting unit, the separated electrode including a third electrode and a fourth electrode, the third electrode formed to have a planar size smaller than a planar size of the second electrode, wherein the fourth electrode extends at least to a boundary of the second pixel and is formed in a region which is vacant due to the smaller planar size of the third electrode, wherein the second pixel is a phase difference pixel which generates a signal for detecting a focal point, and wherein the fourth electrode is connected to a semiconductor region disposed in a semiconductor substrate.

12. The solid-state image sensor according to claim 2, further comprising:
an insulating layer that separates the second, third, and fourth electrodes;

a conductive structure partially disposed in the insulating layer and that connects the semiconductor region to the fourth electrode.

13. The solid-state image sensor according to claim 12, wherein the second pixel includes a photoelectric conversion region disposed in the semiconductor substrate below the third electrode, and wherein the conductive structure includes a first conductive part disposed in the insulating layer, a second conductive part disposed in the semiconductor substrate, and a third conductive part disposed in a wiring layer below the semiconductor substrate.

14. The solid-state image sensor of claim 13, further comprising:
an insulating film on sidewalls of the second conductive part.

* * * * *